US008878306B2

(12) United States Patent
Kajimoto et al.

(10) Patent No.: US 8,878,306 B2
(45) Date of Patent: Nov. 4, 2014

(54) SEMICONDUCTOR DEVICE

(71) Applicant: Kabushiki Kaisha Toshiba, Tokyo (JP)

(72) Inventors: Minori Kajimoto, Yokkaichi (JP); Mitsuhiro Noguchi, Yokohama (JP); Hiroyuki Nitta, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/743,995

(22) Filed: Jan. 17, 2013

(65) Prior Publication Data
US 2013/0140644 A1   Jun. 6, 2013

Related U.S. Application Data

(63) Continuation of application No. 11/419,079, filed on May 18, 2006, now Pat. No. 8,377,720.

(30) Foreign Application Priority Data

May 19, 2005  (JP) ................. 2005-146822

(51) Int. Cl.
*H01L 27/088* (2006.01)
(52) U.S. Cl.
USPC ........................................ 257/392
(58) Field of Classification Search
USPC ........................................ 257/392
See application file for complete search history.

(56) References Cited

U.S. PATENT DOCUMENTS

| | | | | |
|---|---|---|---|---|
| 3,897,282 A | * | 7/1975 | White .......................... | 438/145 |
| 3,899,363 A | * | 8/1975 | Dennard et al. ............. | 438/298 |
| 4,085,498 A | * | 4/1978 | Rideout ....................... | 438/241 |
| 4,183,040 A | * | 1/1980 | Rideout ....................... | 257/300 |
| 4,205,330 A | * | 5/1980 | Klein ........................... | 257/392 |
| 5,241,208 A | * | 8/1993 | Taguchi ....................... | 257/410 |
| 5,712,178 A | | 1/1998 | Cho et al. | |
| 5,861,347 A | * | 1/1999 | Maiti et al. .................. | 438/787 |
| 5,940,708 A | * | 8/1999 | Aoyama et al. .............. | 438/275 |
| 5,963,803 A | * | 10/1999 | Dawson et al. .............. | 438/231 |
| 6,037,201 A | * | 3/2000 | Tsai et al. .................... | 438/197 |
| 6,110,782 A | * | 8/2000 | Chu et al. .................... | 438/275 |
| 6,222,225 B1 | | 4/2001 | Nakamura et al. | |
| 6,432,776 B1 | * | 8/2002 | Ono ............................. | 438/275 |

(Continued)

FOREIGN PATENT DOCUMENTS

JP    8-125031    5/1996
JP    8-195441    7/1996

(Continued)

OTHER PUBLICATIONS

JPO Office Action issued Aug. 3, 2010, in Japan Patent Application No. 2005-146822, filed May 19, 2005 (with English translation).

(Continued)

*Primary Examiner* — Caleb Henry
(74) *Attorney, Agent, or Firm* — Oblon, Spivak, McClelland, Maier & Neustadt, L.L.P.

(57) ABSTRACT

A method of manufacturing a semiconductor device involves process for forming gate insulating films of different thickness on a semiconductor substrate, depositing films that constitute a gate electrode, removing the gate insulating films having different thickness formed on an impurity diffusion region surface of a transistor including the gate electrode, and doping impurities into a portion where the gate insulating film is removed.

8 Claims, 21 Drawing Sheets

(56) References Cited

U.S. PATENT DOCUMENTS

| | | | |
|---|---|---|---|
| 6,545,311 B2 | 4/2003 | Shukuri et al. | |
| 6,646,313 B2 * | 11/2003 | Shukuri et al. | 257/392 |
| 6,657,249 B2 | 12/2003 | Nishioka et al. | |
| 6,770,535 B2 | 8/2004 | Yamada et al. | |
| 6,828,185 B2 * | 12/2004 | Lim et al. | 438/216 |
| 6,853,030 B2 * | 2/2005 | Yoshiyama et al. | 257/324 |
| 6,906,954 B2 | 6/2005 | Shukuri et al. | |
| 7,023,062 B2 * | 4/2006 | Shukuri et al. | 257/392 |
| 7,038,283 B2 * | 5/2006 | Yanai et al. | 257/392 |
| 7,067,881 B2 * | 6/2006 | Matsumoto et al. | 257/347 |
| 7,122,435 B2 * | 10/2006 | Chidambaram et al. | 438/303 |
| 7,265,419 B2 * | 9/2007 | Minami | 257/347 |
| 7,423,283 B1 * | 9/2008 | Luo et al. | 257/19 |
| 2002/0031877 A1 | 3/2002 | Arai | |
| 2004/0222465 A1 * | 11/2004 | Matsumoto et al. | 257/347 |
| 2005/0064689 A1 * | 3/2005 | Mouli | 438/586 |

FOREIGN PATENT DOCUMENTS

| | | |
|---|---|---|
| JP | 2000-174150 | 6/2000 |
| JP | 2002-270795 | 9/2002 |
| JP | 2002-299475 | 10/2002 |

OTHER PUBLICATIONS

Decision of Refusal issued Nov. 9, 2010, in Japanese Patent Application No. 2005-146822 (with English translation).

* cited by examiner

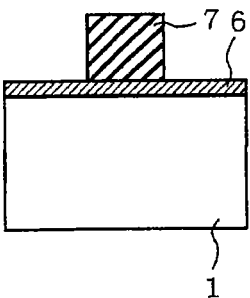 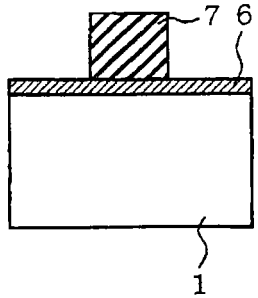 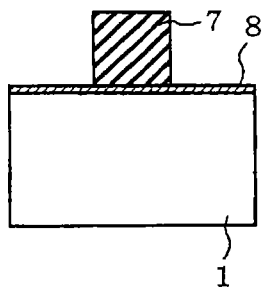
FIG.8A   FIG.8B   FIG.8C
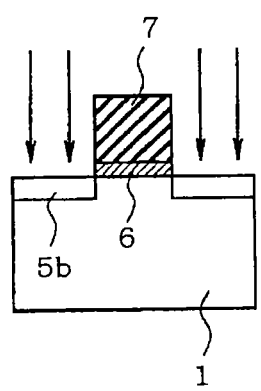 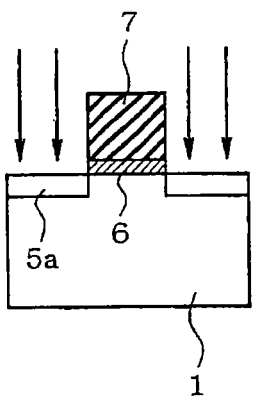 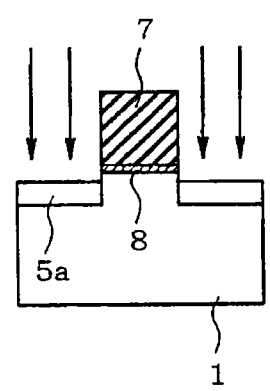
FIG.9A   FIG.9B   FIG.9C

SEMICONDUCTOR DEVICE

CROSS-REFERENCE TO RELATED APPLICATIONS

The present continuation application claims the benefit of priority under 35 U.S.C. 120 to application Ser. No. 11/419,079, filed on May 18, 2006, and claims the benefit of priority under 35 U.S.C. 119 from Japanese Patent Application No. 2005-146822, filed on, May 19, 2005. The entire contents of U.S. patent application Ser. No. 11/419,079 and JP Patent Application 2005-146822 are hereby incorporated herein by reference.

BACKGROUND OF THE INVENTION

1. Field of the Invention

The present invention relates to a method of manufacturing a semiconductor device, particularly to a semiconductor device including a memory cell region and peripheral circuit region, the peripheral circuit region having a high-voltage transistor and a low-voltage transistor.

2. Description of the Related Art

Among semiconductor devices, a typical nonvolatile memory such as a NAND flash memory includes a memory cell and a peripheral circuit cell. The memory cell is driven by the peripheral circuit cell and is provided with a low-voltage transistor. The peripheral circuit cell, on the other hand, is generally provided with both types of high- and low-voltage transistors of p-type and n-type respectively.

Impurities are doped into a semiconductor substrate by way of ion implantation to form a source/drain region for each transistor. At this time, in the case of a high-voltage transistor having a thick gate insulating film, the gate insulating film formed on the semiconductor substrate surface needs to be removed upon ion implantation. The gate insulating film formed an the impurity diffusion region is removed by patterning a resist by lithography process.

On the other hand, the low-voltage transistor has a thin gate insulating film. Therefore, in the ion implantation process for forming the source/drain region, a predetermined diffusion region can be formed by implanting ions without removing the gate insulating film formed on the semiconductor substrate surface. A complimentary metal oxide semiconductor integrated circuit (CMOSIC) technology using the above process is disclosed in JP-A-H08-125031.

In the above described conventional manufacturing method, the process to remove the gate insulating film in the high- and low-voltage transistors respectively is performed separately. This is due to difference in the film thickness of the respective transistors. That is, in case the gate insulating films are removed simultaneously, because the low-voltage transistor has a thinner gate insulating film, the gate insulating film of the low-voltage transistor is etched away before the high-voltage transistor exposes the underlying silicon substrate surface.

In such case, it is not possible to selectively etch the gate insulating film alone by an anisotropic etch process such as RIE (Reactive Ion Etching) process. Therefore, even if the etch process is performed with a higher selective ratio in relative to silicon; the silicon substrate surface still becomes etched. Due to the electrical characteristic of a transistor, such configuration results in adverse effects such as a short channel effect. Thus, the process of removing the gate insulating films of different thickness need to be carried out separately, thereby not being able to reduce the times of lithography process.

BRIEF SUMMARY OF THE INVENTION

Therefore, the purpose of the present disclosure is to provide a method of manufacturing a semiconductor device comprising transistors employing gate electrodes provided with gate insulating films of different thickness that offers advantageous and shortened process cycle for forming an impurity diffusion region on a semiconductor substrate.

The method of manufacturing a semiconductor device of the present invention involves process of forming gate insulating films of different thickness on a semiconductor substrate, depositing films that constitute a gate electrode, forming the gate electrode by isolating the deposited films by an etch process, removing the gate insulating films of different thickness formed on an impurity diffusion region surface of a transistor including the gate electrode, and doping impurities into a portion where the gate insulating film is removed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

Other objects, features and advantages of the present invention will become clear upon reviewing the following description of the embodiment with reference to the accompanying drawings, in which.

FIGS. 3A to 3C, 4A to 4C, 5A to 5C, 6A to 6C, 7A to 7C, 8A to 8C and 9A to 9C are sectional views corresponding to each manufacturing process;

DETAILED DESCRIPTION OF THE PREFERRED EMBODIMENTS

A first embodiment example that applies the present invention to a flash memory will be described with reference to FIGS. 1 to 19.

Figure 1A:
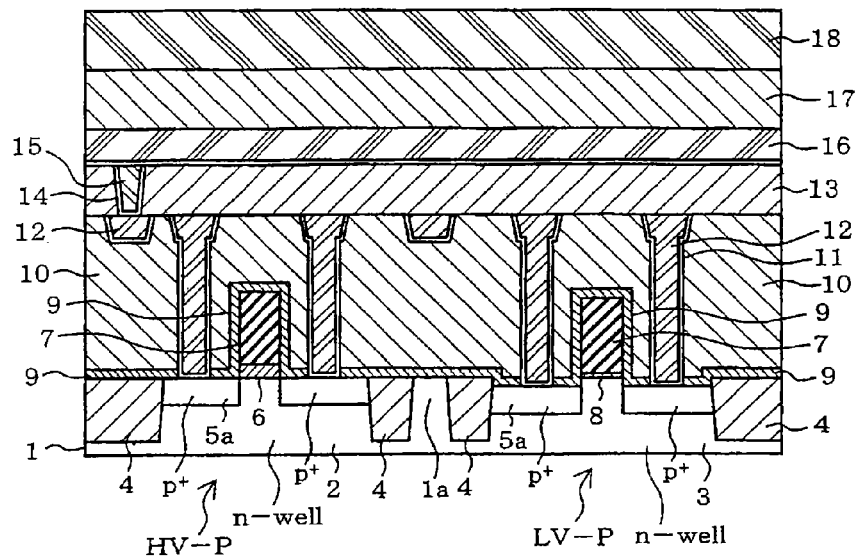
FIGS. 1A and 1B are schematic sectional views indicating a first embodiment of the present invention.
Figure 1B:
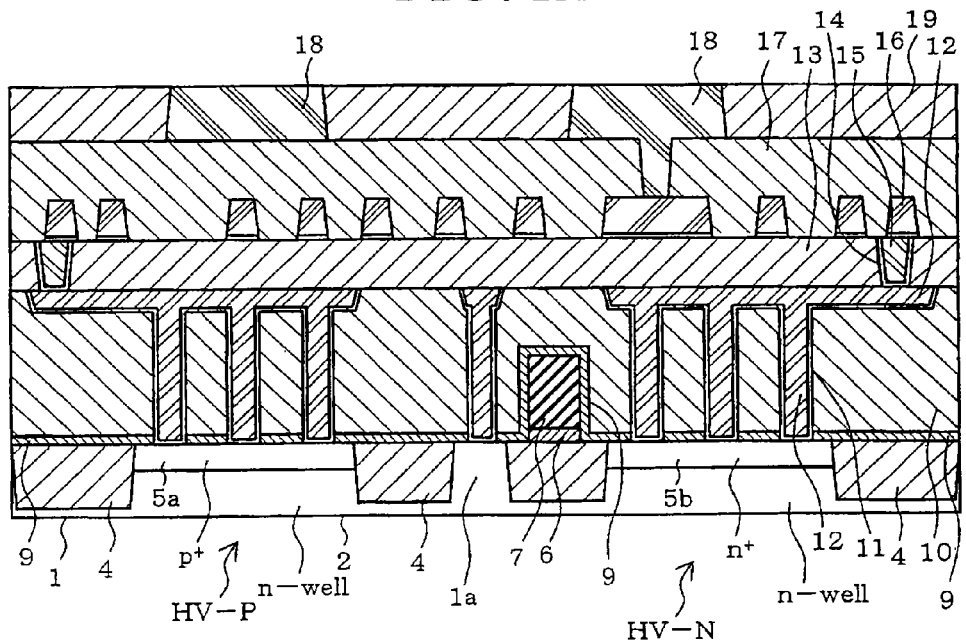
Figure 2:
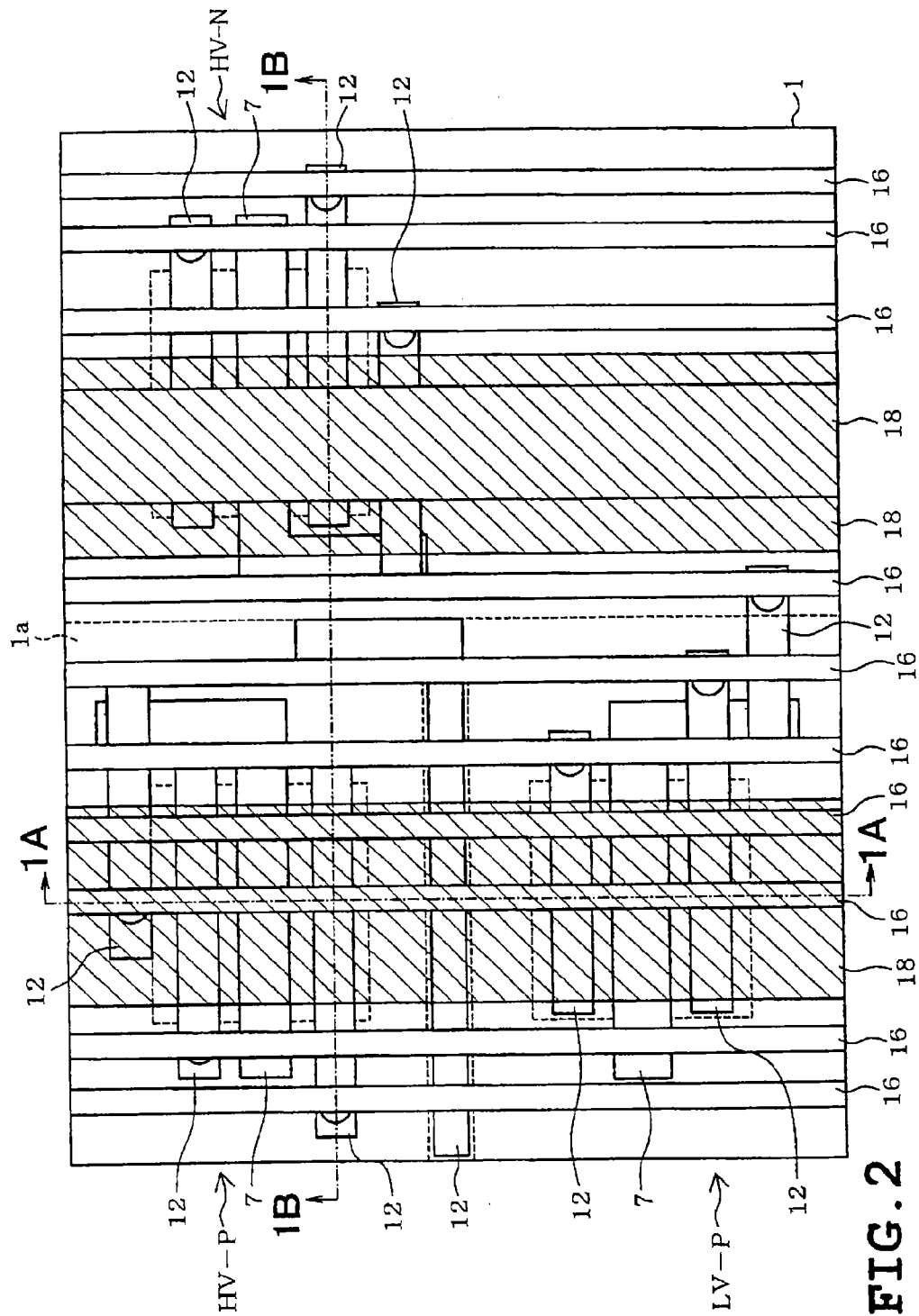
FIG. 2 is a schematic plan view.

FIGS. 1A, 1B, and 2 illustrate a cross section and a plan view of a transistor formed on a peripheral circuit of the flash memory. The plan view indicated in FIG. 2 exemplifies a part of a p-conduction type silicon substrate 1 whereby a high-voltage P-channel transistor HV-P, a high-voltage N-channel transistor HV-N, and a low-voltage P-channel transistor LV-P are illustrated in the upper left, upper right, and lower left of the figure respectively; and a transistor-less state is indicated in the lower right. Since the low-voltage N-channel transistor provided in the peripheral circuit region is irrelevant to the process at issue, no reference is made in the present embodiment.

FIGS. 1A and 1B illustrate a vertical section of a portion taken along lines 1A-1A and 1B-1B in FIG. 2. That is, FIG. 1A is a vertical section that transverse the gate electrodes of the high-voltage P-channel transistor HV-P and the low-voltage P-channel transistor LV-P. FIG. 1B is a vertical section view of an impurity diffusion region taken along the gate electrodes of the high-voltage P-channel transistor HV-P and low-voltage P-channel transistor LV-P.

In FIGS. 1A and 1B, n-wells 2 and 3 of the high-voltage P-channel transistor HV-P and the low-voltage P-channel transistor LV-P respectively are formed on the p-type silicon substrate 1. The high-voltage N-channel transistor HV-N is formed directly on the p-type silicon substrate 1 without forming any well.

The region formed with each well 2 and 3 is referred to as an element forming regions. An STI (Shallow Trench Isolation) 4 is defined on the silicon substrate 1 surrounding the periphery of the element forming region. As will be described later, STI 4 is a shallow trench and is filled with an insulating film such as a silicon oxide film.

Impurity diffusion regions 5a and 5b are formed on the element forming region of the silicon substrate 1 surrounded by STI 4. By doping impurities on the impurity diffusion regions 5a and 5b by way of ion implantation, diffused source/drain are formed respectively. In this case, a p-type impurity diffusion region 5a is formed on the P-channel transistors HV-P and LV-P and an n-type impurity diffusion region 5b is formed on the N-channel transistors HV-N. A guard ring 1a which is a region exposing the silicon substrate 1 surface is formed on the outer periphery of the STI 4. As will be described later, impurities are doped into this portion to form a contact, thus rendering a function of a guard ring.

The silicon substrate 1 surface of the low-voltage P-channel transistor LV-P is recessed lower than the silicon substrate 1 surface of the high-voltage P-channel transistors HV-P and high-voltage N-channel transistor HV-N. Such height difference is created in the attempt to remove the gate insulating films 6 and 8 of different thickness by performing a simultaneous etch, whereby the so called silicon gouging occurs where the silicon substrate 1 underlying the low-voltage P-channel transistor LV-P is slightly recessed by the etching process.

The above described silicon gouging occurs because the gate insulating films 6 and 8 cannot be etched with an infinite selective ratio in relative to silicon. That is, the surface of the silicon substrate 1 underlying the gate insulating film 8 of the low-voltage P-channel transistor LV-P is exposed by the etch process in prior to completing the etch process of the gate insulating film 6 of the high-voltage transistors HV-P and HV-N. Thereafter, the silicon substrate 1 surface is continuously etched until the gate insulating film 6 of the high-voltage transistors HV-P and HV-N are etched away.

The gate insulating film 6 and a gate electrode 7 having large film thickness are provided on the surface of the silicon substrate 1 of the high-voltage transistors HV-P and HV-N, more specifically, between the source/drain regions formed as impurity diffusion regions 5a and 5b. The gate insulating film 6 formed by a silicon oxide film for high-voltage use has a thickness for example of 40 nm.

Also, the gate electrode 7 is formed by depositing an amorphous silicon film, an ONO (oxide-nitride-oxide) film, a polycrystalline silicon film, and a tungsten silicide film (WSi) This film configuration is identical to the film configuration of the gate electrode for the memory cell transistor not shown. The ONO film constitutes the floating gate for the memory cell transistor. Since each transistor in the peripheral circuit region does not require a floating gate, an opening is partially defined in the deposited ONO film so as to electrically short-circuit the upper layer and the lower layer.

FIG. 1B illustrates the gate electrode 7 of the high-voltage N-channel transistor HV-N being formed on the STI 4, exemplifying a case where gate contact is obtained via the STI 4.

The gate insulating film 8 and gate electrode 7, both comprising a thin film, are formed between the source/drain regions of the impurity diffusion region 5a on the surface of the silicon substrate 1 of the low-voltage P-channel transistor LV-P. The gate insulating film 8 for low-voltage use is formed by a silicon oxide film having a thickness, for example, of 8 nm.

A barrier insulating film 9 is formed on the silicon substrate 1 surface inclusive of the gate electrode 7. The barrier insulating film 9, functioning as an etch stopper, is formed by, for example, a silicon nitride film, the silicon oxinitride film, and an oxide aluminum film. An interlayer insulating film 10 is formed on top of the barrier insulating film 9. The interlayer insulating film 10 comprises, for example, the silicon oxide film, the silicon nitride film, a silicate glass such as BPSG and PSG, and low-k (low-k dielectric) materials such as HSQ, MSQ, and SiLK (registered trademark).

A plurality of contact holes are defined in the interlayer insulating film 10 for contacting the source/drain of each transistor HV-P, HV-N, and LV-P. A barrier metal 11 of small film thickness is formed on the inner periphery of the contact holes, and a contact plug 12 is filled inside the contact holes. The barrier metal 11 may comprise Ti, Ta, TaN, TiN, or the like. Also, the contact plug 12 may comprise metal materials such as W (tungsten), Al (aluminum) and Cu (copper).

An interlayer insulating film 13 made of insulating material similar to the above described interlayer insulating film 10 is formed above the interlayer insulating film 10. A first via contact hole is formed on a part of the interlayer insulating film 13 and a first via contact plug 15 is filled therein with a barrier metal 14 interposed therebetween. The first via contact plug 15 is disposed so as to be electrically conductive with the underlying contact plug 12.

A first interconnection layer 16 formed by patterning a metal film such as Al and AlCu is formed on top of the interlayer insulating film 13. The first interconnection layer 16 is formed to serve as the interconnection layer for a bit line, for example. Further, on top of the first interconnection layer 16, an interlayer insulating film 17 made of material similar to the aforementioned material is formed. A second via contact hole is defined in the interlayer insulating film 17 and a second interconnection layer 18 also serving as the via contact plug is patterned in the interlayer insulating film 17. The second interconnection layer 18 comprises, for example, tungsten, aluminum, or copper. The second interconnection layer 18 is buried into an interlayer insulating layer 19.

Next, a manufacturing process of the above described configuration is described with reference to FIGS. 3 to 19.

Figures 3A, 3B, 3C:
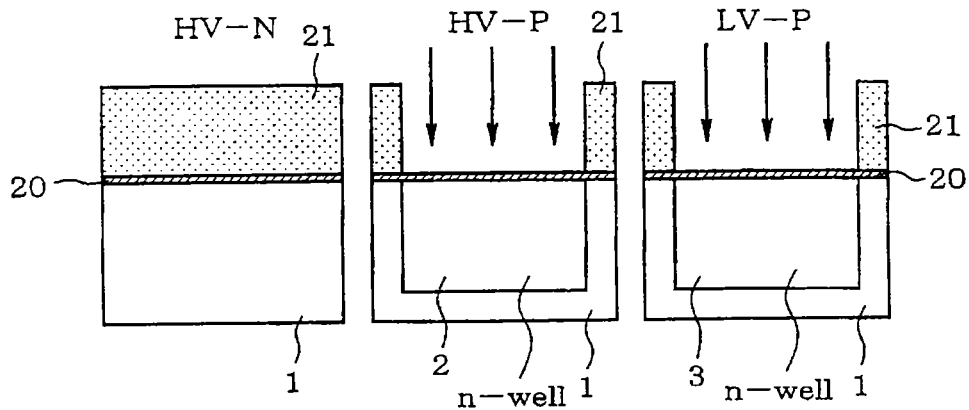

First, as shown in FIGS. 3A to 3C, after cleaning the p-type silicon substrate 1, a sacrificial oxide film 20 is formed to prevent contamination of the substrate and to serve as a backup in case of unsuccessful resist lithography. Subsequently, a lithography process for forming the high-voltage P-channel transistor HV-P and low-voltage P-channel transistor LV-P is performed and the resist 21 is patterned to define an opening therein. Successively, using the aforesaid resist 21 as a mask, P (phosphorus) or As (arsenic) ions are doped in a dose on the order of $1.0 \times 10^{12}$ to $1.0 \times 10^{14}$ cm$^{-2}$ in the surface of the silicon substrate 1 to form the n wells 2 and 3.

Thereafter, in order to activate the doped impurity ions, annealing process is normally performed in the range of 800° C. to 1200° C. The annealing process may be performed after forming a p-well in addition to the n-wells 2 and 3 so as to activate the impurity ions altogether. After implanting the impurity ions, the pattern 21 on the resist used as a mask is no longer required, hence is removed by O$_2$ dry asher or chemical treatment.

Next, the sacrificial oxide film 20 is removed by chemical treatment such as hydrofluroic acid treatment and the gate insulating films 6 and 8 are formed thereafter. Normally, among the gate insulating films 6 and 8, the film thickness of the gate insulating film in the low-voltage transistor region are arranged so as to have the same film thickness as the transistors in the memory array. However, the gate insulating films of the low-voltage transistor region are occasionally arranged to have different film thickness from the memory region transistors in view of improving the transistor performance.

Figures 4A, 4B, 4C:
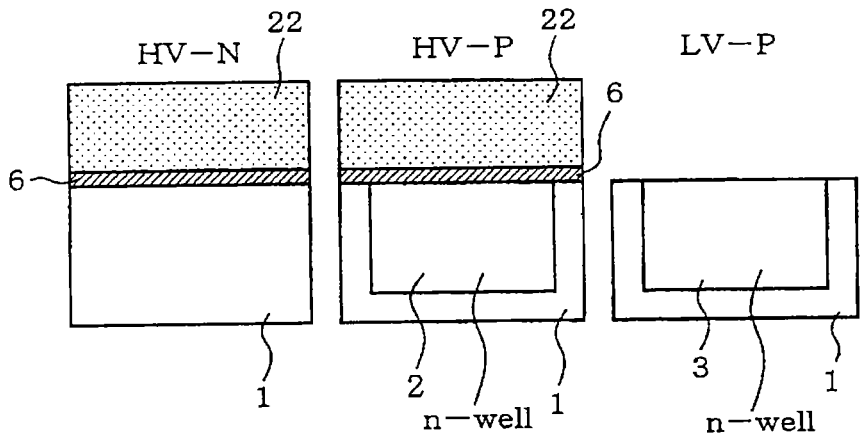
Figures 5A, 5B, 5C:
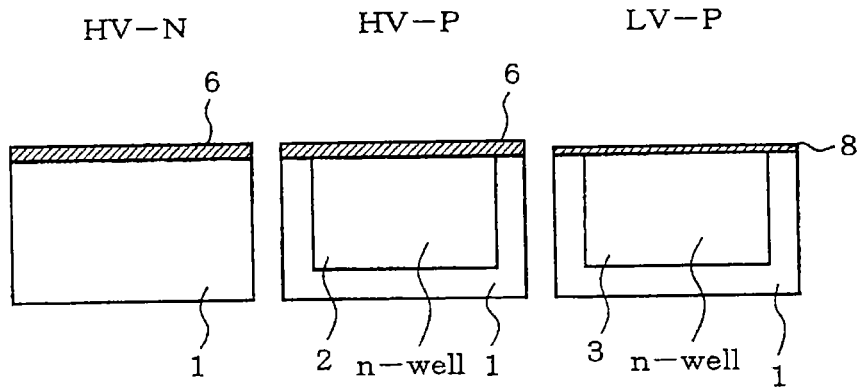

After forming the gate insulating film 6 for the high-voltage transistors HV-P and HV-N, in order to form the gate insulating film 8 for the low-voltage P-channel transistor LV-P, the gate insulating film 6 formed on the targeted regions is removed. At this time, since the gate insulating film 6 for high-voltage transistors HV-P and HV-N need to be left intact, as shown in FIGS. 4A to 4C, the resist 22 is patterned by lithography process to define an opening in the low-voltage transistor LV-P region alone, and the thick gate insulating film 6 is removed by performing wet etch with hydrofluoric acid, or the like. Thereafter, as shown in FIGS. 5A to 5C, the gate insulating film 8 is formed on the low-voltage transistor LV-P surface. Thus, two types of gate insulating films 6 and 8 having different thickness are formed respectively.

Figures 6A, 6B, 6C:
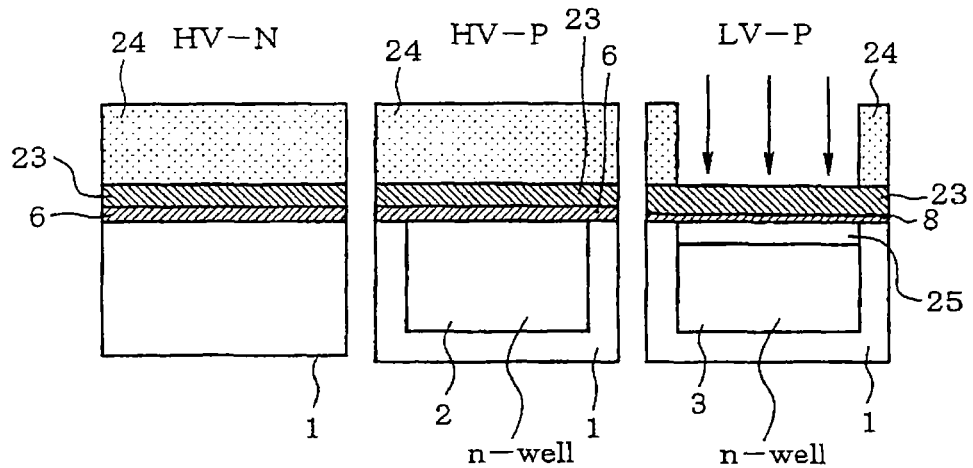

Next, as shown in FIGS. 6A to 6C, a non-doped amorphous silicon film 23 is deposited in a film thickness of approximately 40 nm by LP-CVD (Low Pressure-Chemical Vapor Deposition) process to form a floating gate electrode configuration on the cell transistor (not shown) in the memory region.

Subsequently, impurities are doped into the n-well 3 of the low-voltage P-channel transistor LV-P so as to regulate a threshold voltage to a predetermined level. Therefore a resist 24 is patterned by lithography process so as to define an opening on the n-well 3 surface of the low-voltage P-channel transistor LV-P.

Using the resist 24 as a mask, impurity ions such as B (boron) are doped into the silicon substrate 1 (refer to FIG. 6C) in a dose on the order of $1.0 \times 0.10^{12}$ to $1.0 \times 0.10^{14}$ cm$^{-2}$ through the deposited amorphous silicon film 23. In case impurity ions are doped through the amorphous silicon film 23, that is, the floating gate; the dose of impurity ions doped into the silicon substrate can be increased as compared to implanting the same in prior to gate insulating film 8 formation.

If the method is adopted where impurity ions are doped in prior to formation of the gate insulating film 8, because of a thermal processing performed upon gate insulating film 8 formation, the doped impurity ions become diffused in the silicon substrate 1. Hence, obtaining the desirable threshold voltage becomes difficult since the dose of the impurity ions falls below the effective level. After doping the impurity ions, the resist 24 used as the mask is no longer required, therefore is removed by O$_2$ dry asher or chemical treatment.

Figures 7A, 7B, 7C:
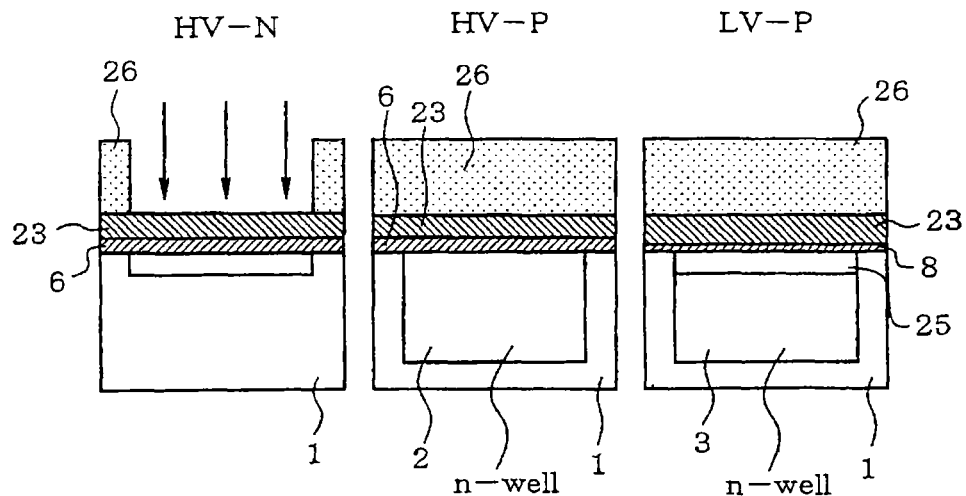

Next, a lithography process is performed to define a threshold voltage for the high-voltage N-channel transistor HV-N to be formed on the p-type silicon substrate 1; whereby a resist 26 is patterned to define an opening for the underlying high-voltage N-channel transistor HV-N to which ion implantation is to be carried out. As shown in FIGS. 7A to 7C, impurity ions such as B (boron) in a dose on the order of $1.0 \times 10^{11}$ to $1.0 \times 10^{14}$ cm$^{-2}$ is doped into the targeted portion of the silicon substrate 1 through the deposited floating gate electrode 23. The advantage of implanting impurity ions through the floating gate electrode 23 is as described earlier. After implanting impurity ions, the resist 26 used as a mask, which is no longer used, is removed by O$_2$ dry asher or chemical treatment.

Next, the silicon nitride film, the silicon oxide film, or the like are deposited on top of the amorphous silicon film 23 formed on the silicon substrate 1. Then, the resist 26 is patterned by lithography process and STI 4 forming region is opened. Using the resist 26 as a mask, silicon oxide film is etched by RIE process. Further, using the silicon oxide film as a mask, silicon nitride film, amorphous silicon film 23, gate insulating films 6 and 8, and the silicon substrate 1 are sequentially etched to form a trench on the silicon substrate 1 having a depth on the order of 0.1 μm to 0.4 μm. Furthermore, the trench is filled with insulating film such as silicon oxide film or silicon nitride film. STI 4 is thus formed. The depth of the STI 4 is arranged to an extent enabling the separation of adjacent n wells 2 and 3.

Next, impurity ions such as phosphorus serving as a highly concentrated field-through stopper is doped through the interlayer insulating film so as to improve a punch-through voltage between the N-channel transistors directly formed on the p-type silicon substrate 1 without well isolation.

Thereafter, a conductive film such as polycrystalline silicon film heavily doped with impurities such as phosphorus and tungsten silicide (WSi) film is deposited on the order of 500 nm to 1000 nm. Then, the resist is patterned into a form of data transfer line. The gate electrode 7 is formed by performing anisotropic etch by using the resist as a mask so as to obtain the state illustrated in FIGS. 8A to 8C. At this time, the gate electrode 7 is etched with a higher selective ratio in relative to the resist and the mask, and gate insulating films 6 and 8.

Next, as shown in FIGS. 9A to 9C, each gate film 6 and 8 for high-voltage transistors HV-P, HV-N and low-voltage P-channel transistors are removed. Upon removing the gate insulating film 6 for high-voltage transistors HV-P, HV-N, the gate insulating film 8 of the low-voltage P-channel transistor LV-P is also removed simultaneously. In the case of patterning the resist by lithography process, untargeted portions such as a cell portion, cell contact portion, and gate insulating film portion of the low-voltage N-channel transistors leaves the resist intact with no openings.

The gate insulating film 6 of the high-voltage transistors HV-P and HV-N is approximately 5 times thicker than the gate insulating film 8 for low-voltage P-channel transistor LV-P. Hence, when completely removing the gate insulating film 6 for high-voltage transistors HV-P and HV-N by a process such as RIE process, the gate insulating film 8 for low-voltage P-channel transistor LV-P is over-etched to a considerable extent.

Thus, the gate insulating film requires highly selective etch in relative to the silicon substrate 1. However, since the selective ratio currently applied is approximately 30 at the most, as shown in FIG. 9C, silicon substrate 1 surface of the low-voltage transistor is etched to some extent.

When impurities are doped with the gate insulating film 8 removed from the low-voltage P-channel transistor LV-P, the doping profile of impurity ions inside the substrate peaks at a greater depth as compared to impurity implantation performed under the same condition without removing the gate insulating film 8. Taking the above into consideration, when a voltage acceleration of impurity implantation is reduced upon removing the gate insulating film 8, a projection range of impurity ion implantation Rp is thereby reduced, consequently reducing the standard deviation Rp. As a result, effective channel length between the source/drain can be reduced, thereby restraining the variation of threshold voltage of the transistor.

Also, removal of gate insulating film 8 described above provides the following advantages. That is, impurity implantation becomes independent of the gate insulating film thickness when impurity implantation is performed in a similar manner as the high-voltage transistor impurity diffusion region at the time of depositing impurity diffusion layer of the low-voltage P-channel transistor LV-P. Thus, impurity ion implantation in the diffusion region for high- and low-voltage transistors can be performed under the same condition. Furthermore, by simultaneously opening the high-voltage transistors HV-P and HV-N and the targeted low-voltage P-channel transistor LV-P, the resist patterned in the lithography process performed when removing the gate insulating film 8 can be reused at the time of impurity implantation of the diffusion region after removing the gate insulating films 6 and 8. Thus, the process is simplified.

Figure 10A:
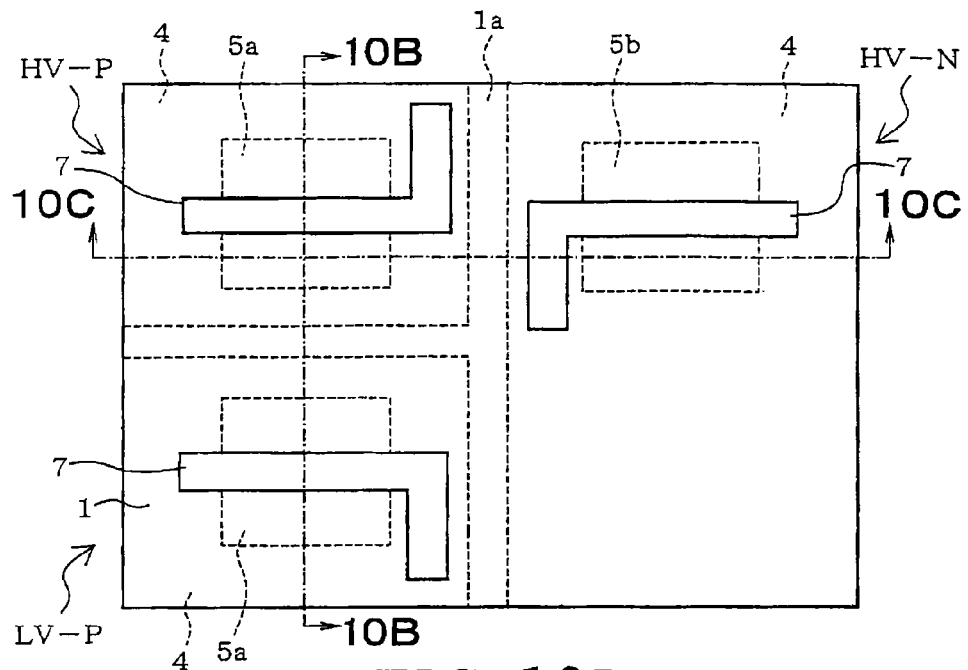
FIGS. 10A to 10C, 11A to 11C, 12A to 12C, 13A to 13C, 14A to 14C, 15A to 15C, 16A to 16C, 17A to 17C, 18A to 18C and 19A to 19C are plan views corresponding to FIG. 2 and sectional views corresponding to FIG. 1 respectively indicating each phase of the manufacturing process.
Figure 10B:
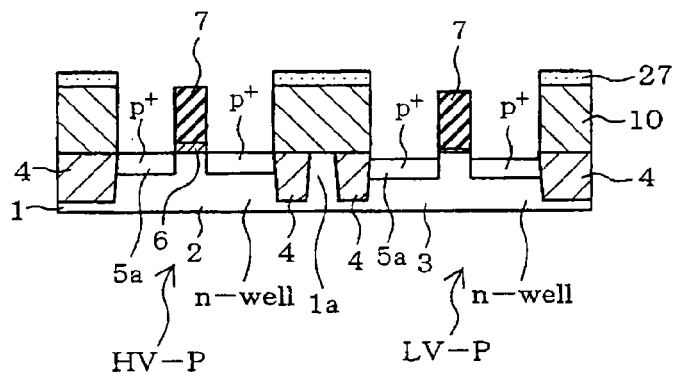
Figure 10C:
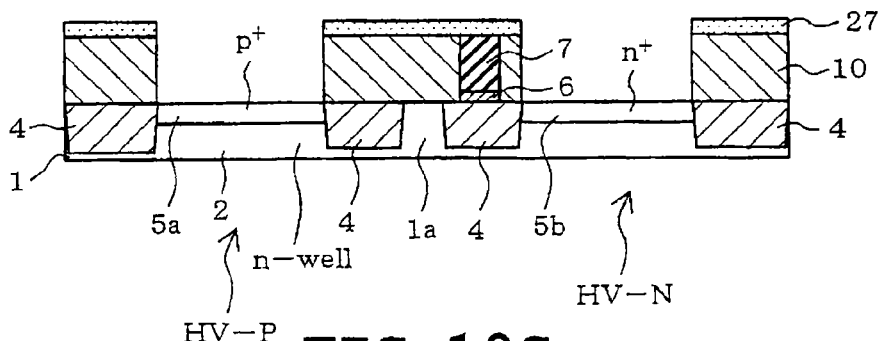

FIGS. 10A to 10C is a plan view and a section view illustrating the transistor formed as described above, where FIG. 10A corresponds to the plan view indicated in FIG. 2 and FIGS. 10B and 10C correspond to a section view indicated in FIGS. 1A and 1B. In the illustrated state, an opening is defined by a resist pattern 27 on the interlayer insulating film 10 deposited on the silicon substrate 1 upper surface and impurity diffusion layer 5a and 5b are formed by removing the gate insulating films 6 and 8. It can be observed that the surface of the silicon substrate 1 of the impurity diffusion layer 5a of the low-voltage P-channel transistor LV-P is slightly recessed.

Figure 11A:
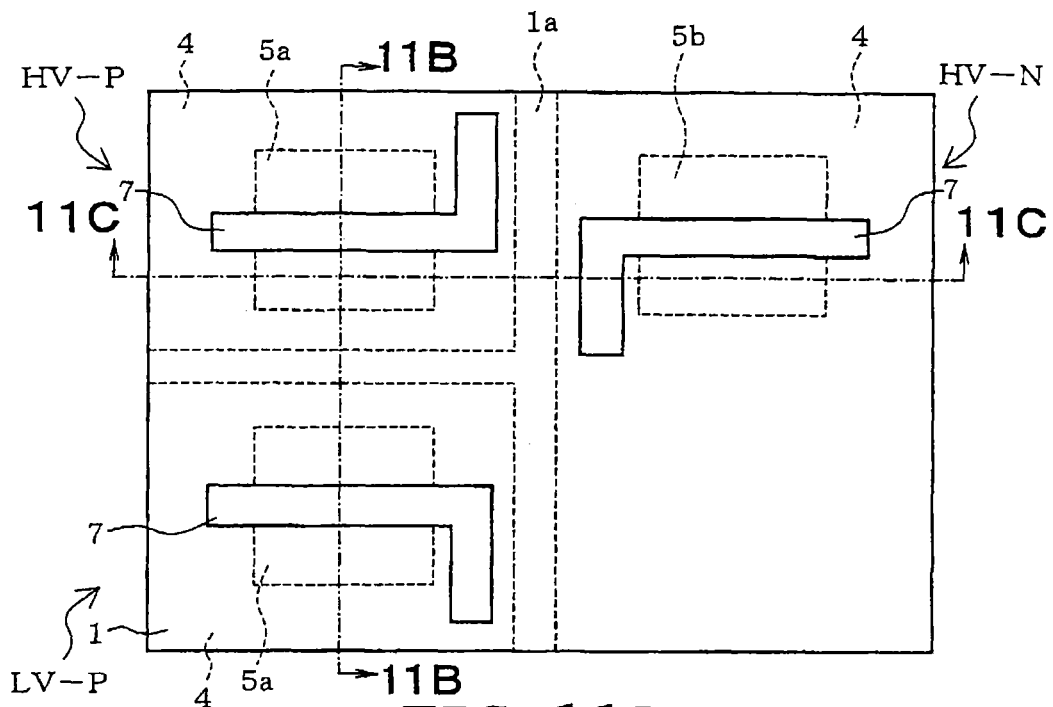
Figure 11B:
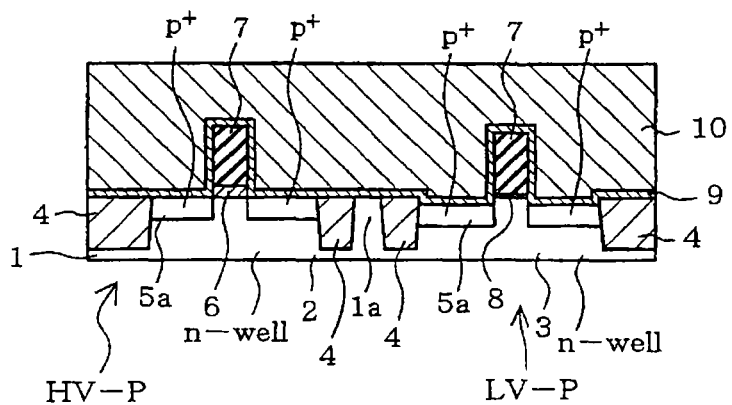
Figure 11C:
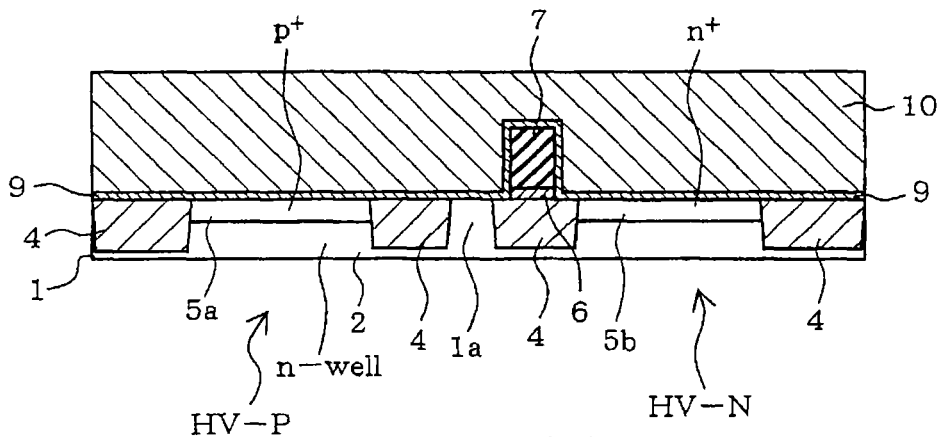

Next, as shown in FIGS. 11A to 11C, the barrier film 9 is deposited in the range of 10 nm to 1000 nm by silicon nitride film or silicon oxynitride film or oxide aluminum film so as to coat the silicon substrate 1 and the gate electrode 7. The barrier insulating film 9 is formed for the following purpose.

That is, in case excessive etching is performed due to poor etching controllability upon defining a contact hole in the interlayer insulating film 10, the contact hole is recessed below the STI 4 (element isolation region) resulting in a failure to ensure the breakdown voltage on the silicon substrate 1 and the contact. On the other hand, insufficient etch upon forming the contact results in an undesirable increase in contact resistance between the n-type region and the data transfer line contact.

Thus, when forming the contact, by providing a barrier insulating film 9 in the interlayer insulating film 10, the interlayer insulating film 10 can be etched under a high selective ratio and low etching speed. Further, by etching the barrier insulating film 9 thereafter, the variation of interlayer insulating film 10 thickness upon contact etching can be made less effective.

Also, in prior to forming the barrier insulating film 9, silicon oxide film ranging from 1 nm to 50 nm may be formed on the silicon substrate 1 surface by oxidation or deposition process. Further, interlayer insulating film 10 comprising silicon oxide film, silicon nitride film, silicate glass such as BPSG and PSG and interlayer films such as HSQ (Hydrogen silsequioxanes), MSQ (methyl silsequioxanes), and SiLK are deposited on the order of 10 nm to 1000 nm.

The interlayer insulating film 10 needs to have a higher selective etching ratio in relative to the material comprising the barrier insulating film 9. The thickness of the barrier insulating film 9 is on the order of 10 nm to 1000 nm, and needs to be provided with sufficient processing margin by the thickness of the interlayer insulating film 10 and the selective etching ratio.

Figure 12A:
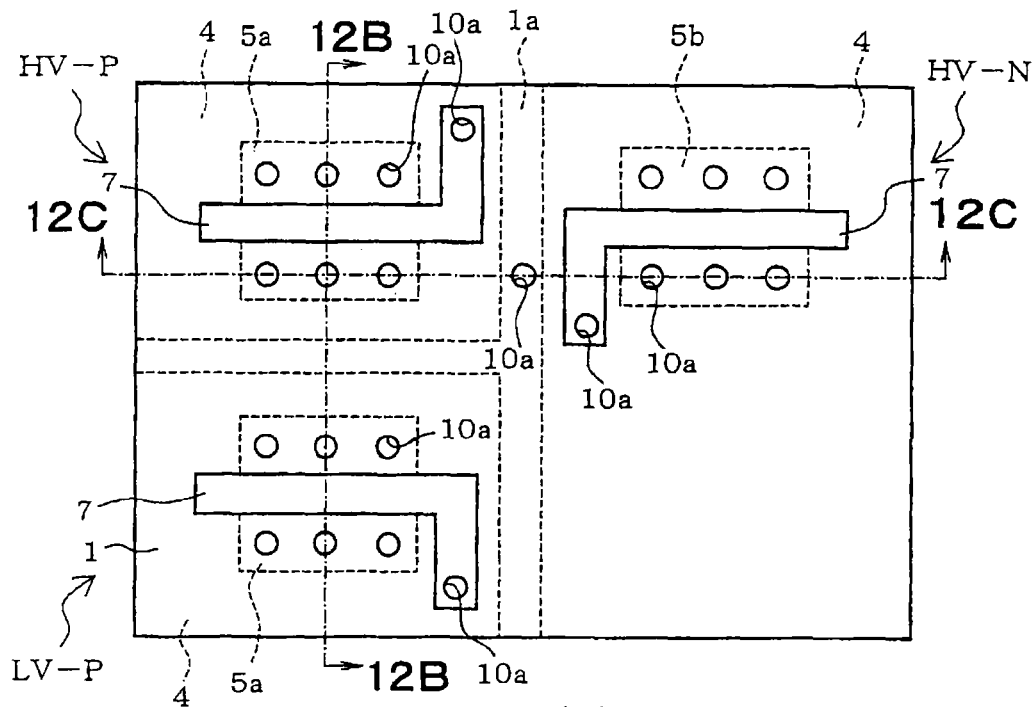
Figure 12B:
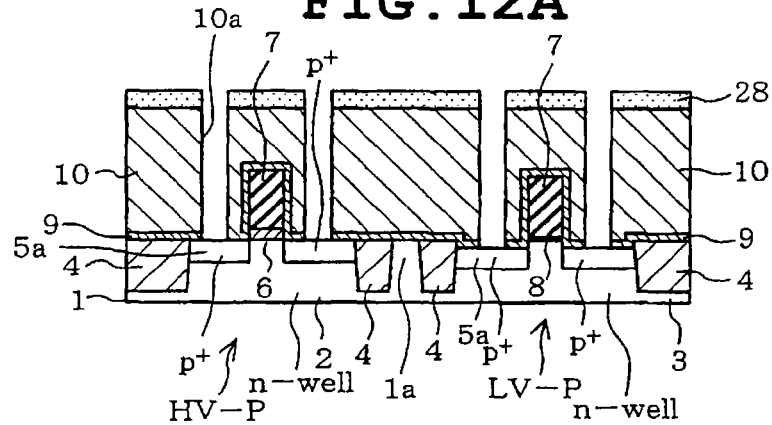
Figure 12C:
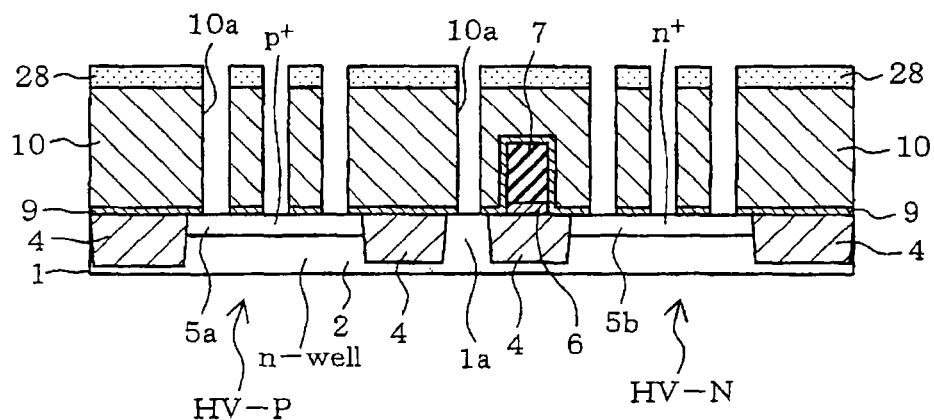

Next, a resist 28 is patterned by lithography process and as shown in FIG. 12A to 12C, an opening 10a is defined for data selection line (gate electrode 7) contact and the substrate source/drain contact. Using the resist 28 as a mask, the interlayer insulating film 10 is patterned by anisotropic etch at which point a high selective ratio is required in relative to the resist 28 and barrier insulating film 9.

After removing the resist 28, the barrier insulating film 9 exposed in the bottom portion of the contact hole is etched anisotropically. It is desirable to etch the barrier insulating film 9 under a higher selective ratio in relative to the silicon substrate 1 and the interlayer insulating film 10 so that the backend process can be dispensed with a wet etch process for removing the barrier insulating film 9, and to maintain a small contact diameter by keeping a positive taper without receding the interlayer insulating film 10.

Figure 13A:
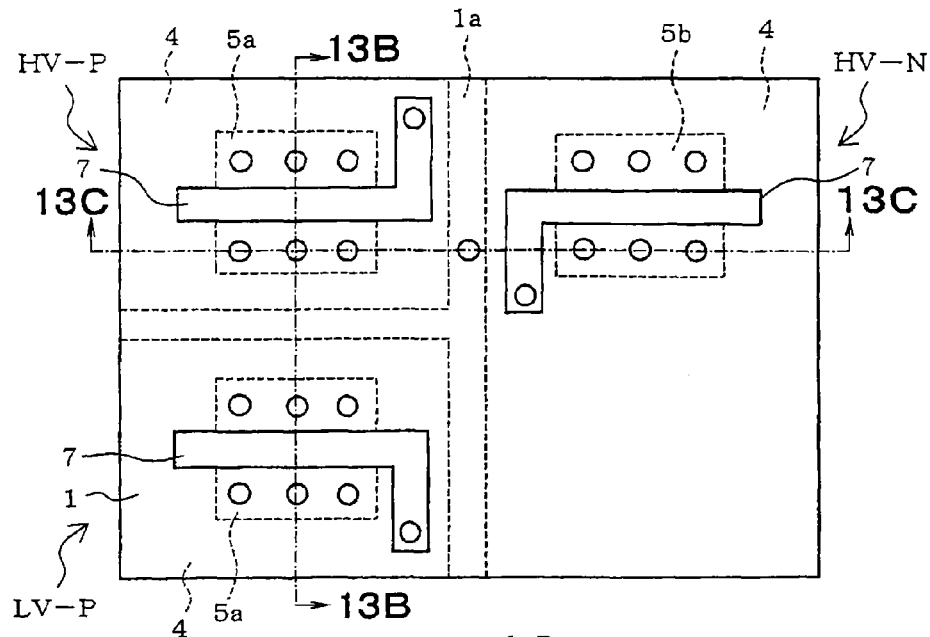
Figure 13B:
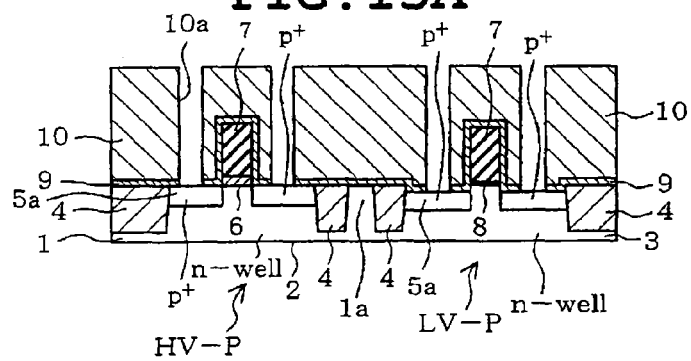
Figure 13C:
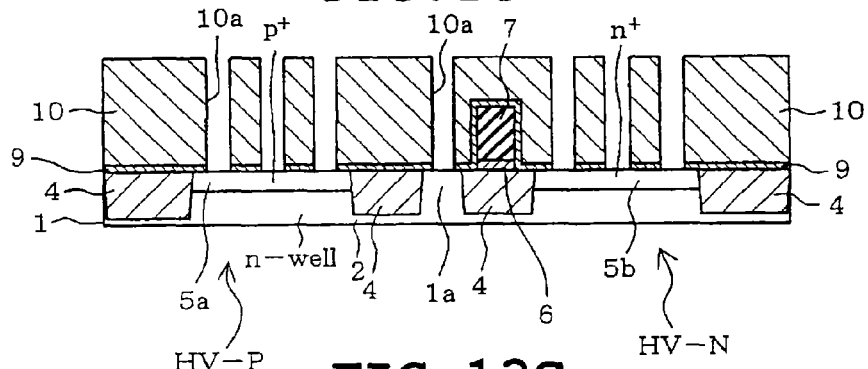

Then, as shown in FIGS. 13A to 13C, ion implantation of phosphorus or arsenic impurities for example may be performed in a dose of $1.0 \times 10^{13}$ cm$^{-2}$ or more to $1.0 \times 10^{16}$ cm$^{-2}$ or lower in order to reduce the resistivity of the n-type region of the contact hole 10a. On the other hand, ion implantation of B (boron) or BF$_2$ (difluoroboron) impurities may be performed in a dose of $1.0 \times 0.10^{13}$ cm$^{-2}$ or more to $1.0 \times 10^{16}$ cm$^{-2}$ or lower to similarly reduce the resistivity of the p-type region of the contact hole 10a.

Figure 14A:
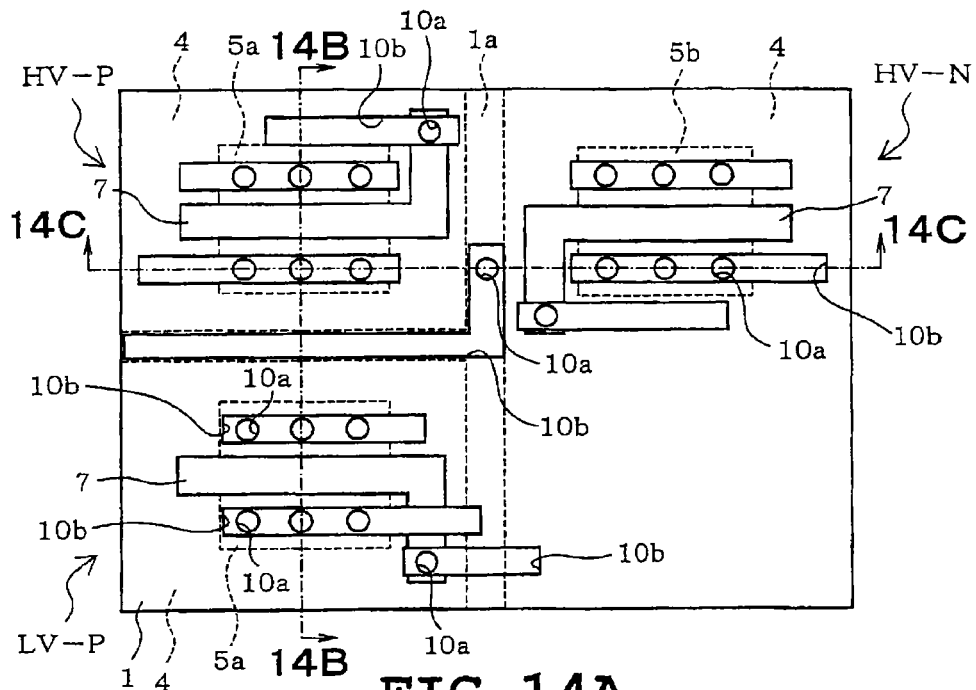
Figure 14B:
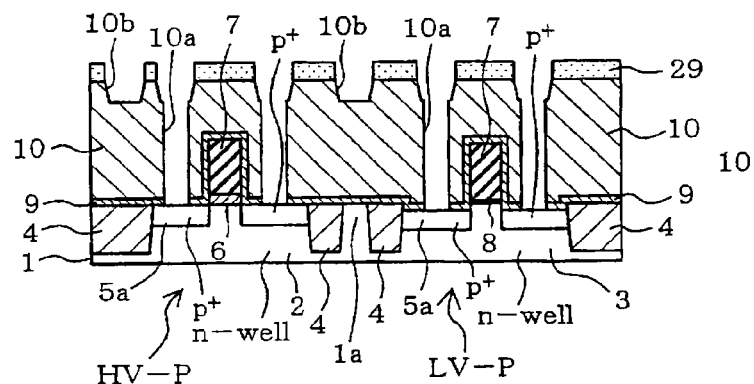
Figure 14C:
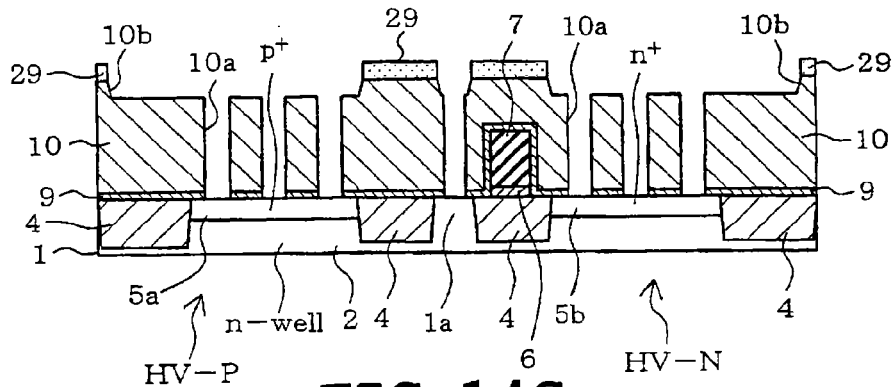
Figure 15A:
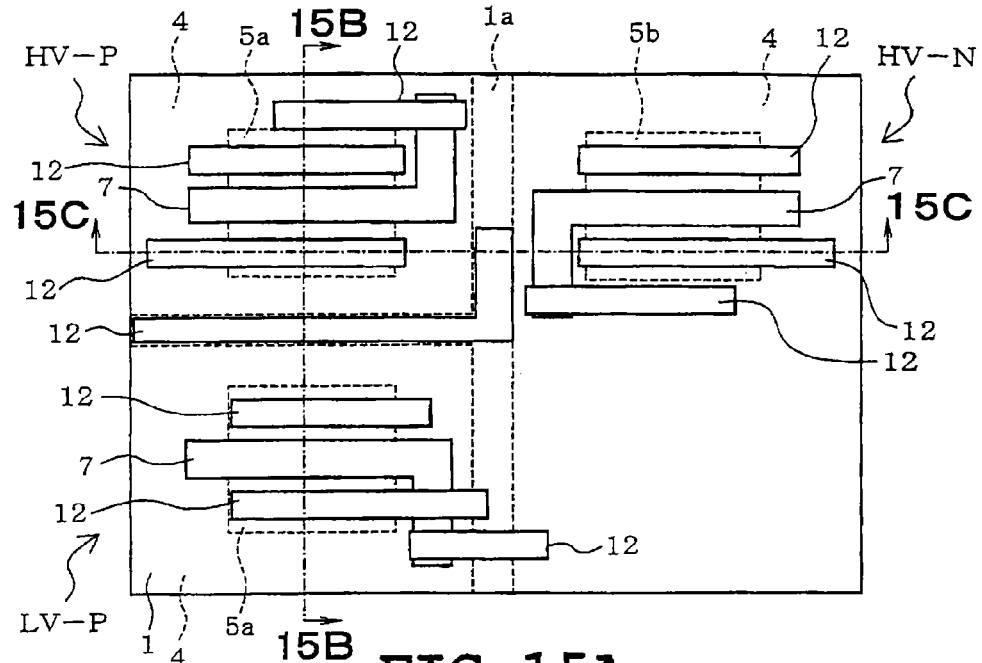
Figure 15B:
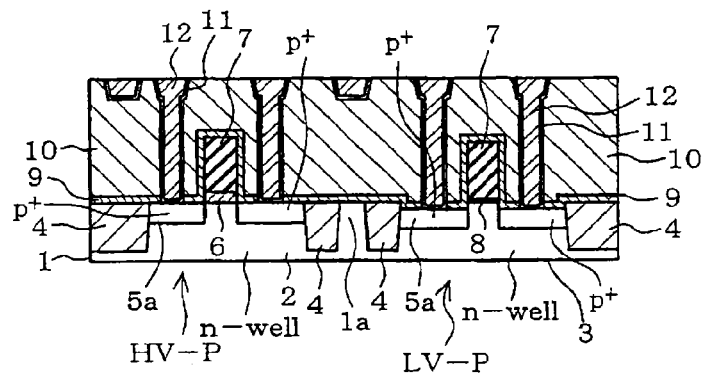
Figure 15C:
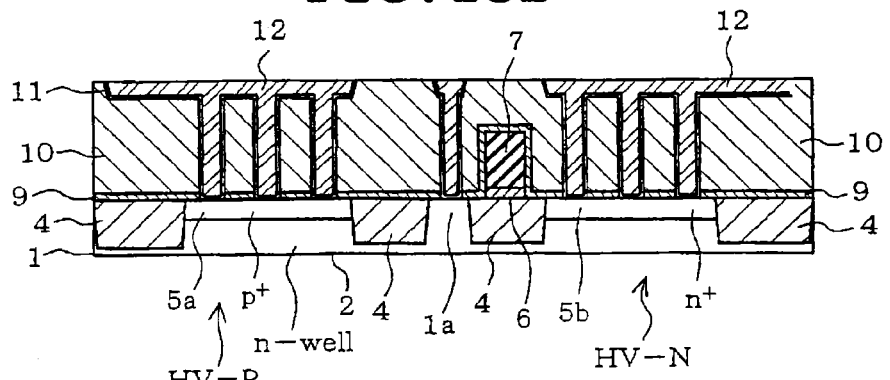

Thereafter, a resist 29 is patterned by lithography process for an outgoing line connected to the contact hole 10a of the source/drain and data selection line, and as shown in FIGS. 14A to 14C, the interlayer insulating film 10 is patterned by anisotropic etch to form an interconnection opening 10b.

Subsequently, the resist 29 is removed and barrier metals 11 such as Ti, Ta, TaN, and TiN are deposited in the contact hole 10a and the interconnection opening 10b in the range of 1 nm to 100 nm by, for example, sputtering or CVD process. Then, metal material such as tungsten, aluminum, and copper are deposited in a thickness of 10 nm to 1000 nm and buried into the contact hole 10a and interconnection opening 10b. Thereafter, planarization process is carried out by CMP (Chemical Mechanical Polishing) process, or the like to obtain a resultant configuration illustrated in FIGS. 15A to 15C. CVD process is preferable in this case since the barrier metal 11 can be deposited evenly in contact holes 10a having higher aspect ratios.

Figure 16A:
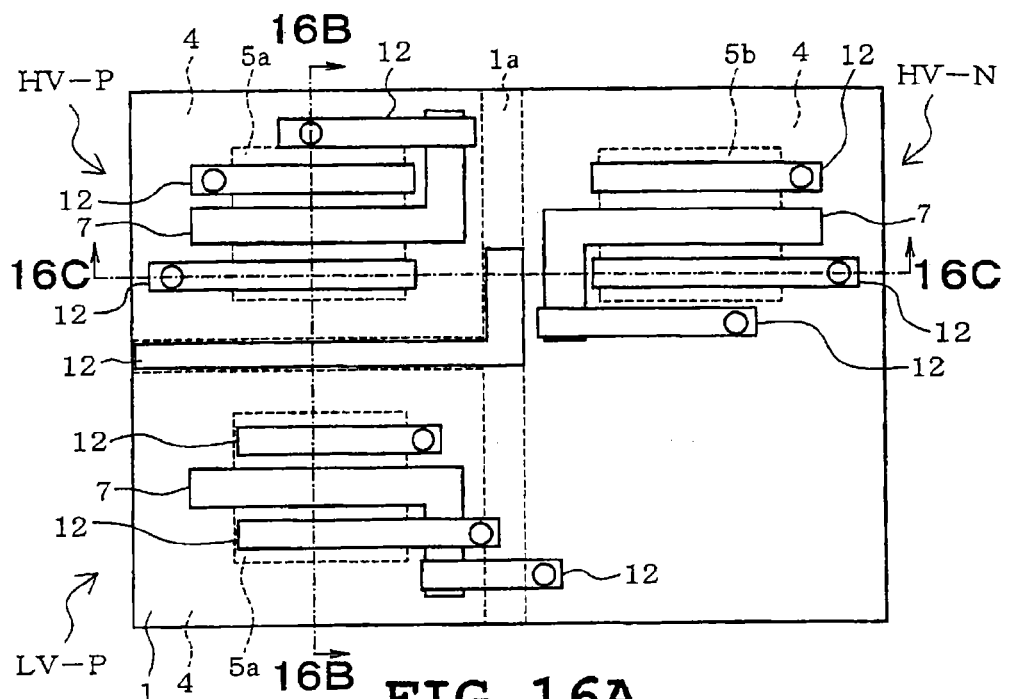
Figure 16B:
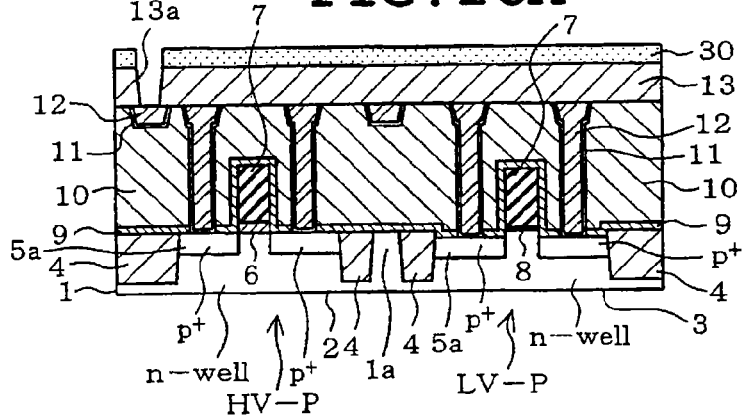
Figure 16C:
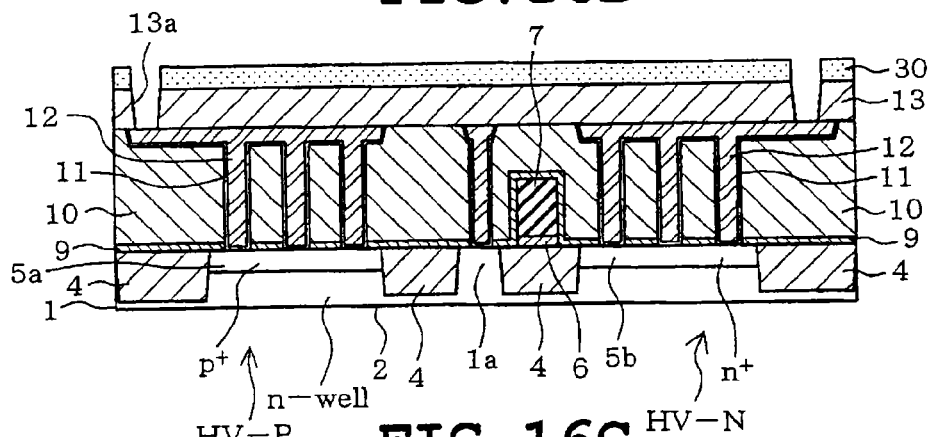
Figure 17A:
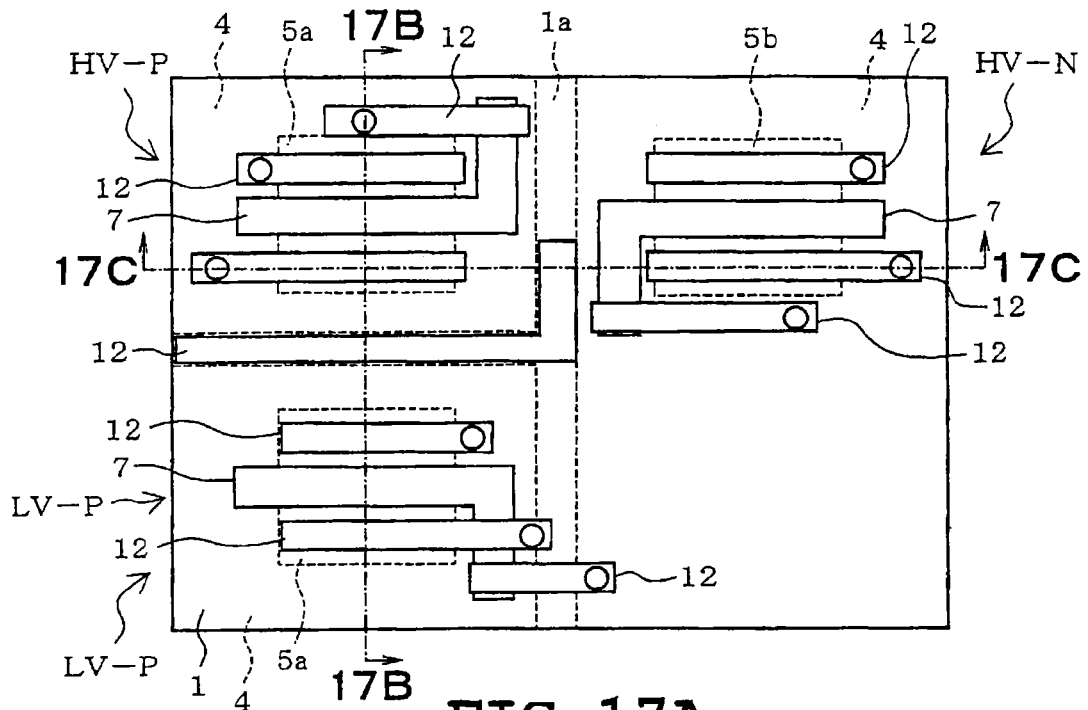
Figure 17B:
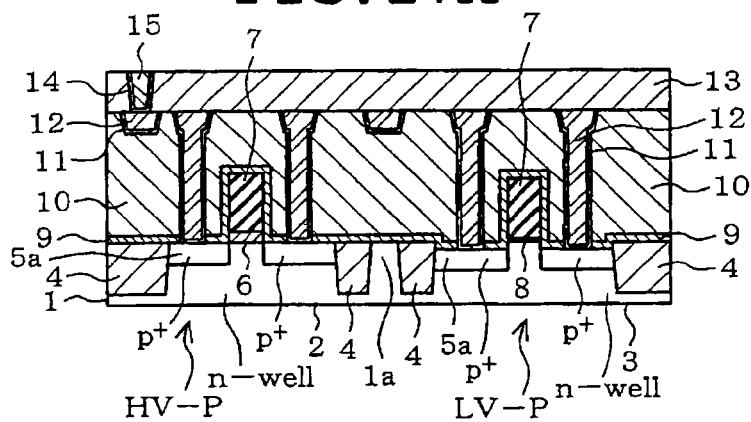
Figure 17C:
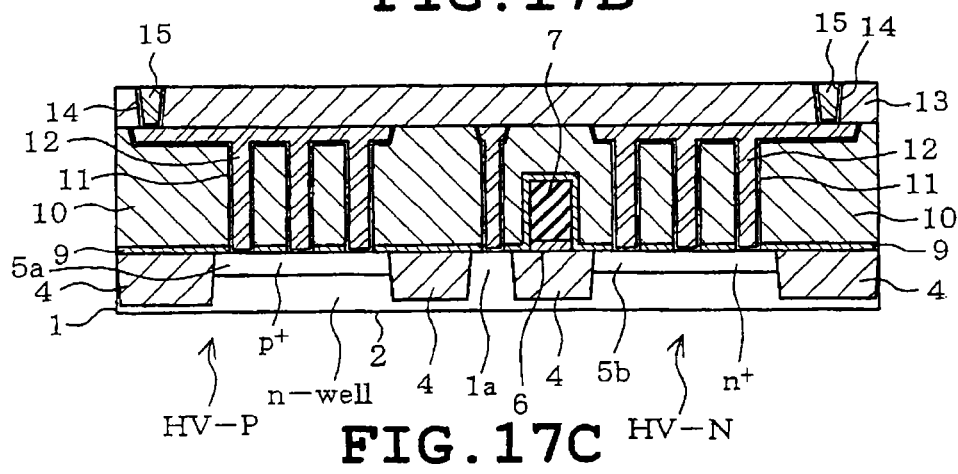

Then, silicon oxide film, silicate glass such as BPSG and PSG, and interlayer insulating film 13 comprising interlayer films such as HSQ, MSQ, and SiLK are deposited on the order of 10 nm to 1000 nm. Next, the first via contact hole 13a is patterned on a resist 30 by lithography process, and as shown in FIGS. 16A to 16C, the first via contact hole 13a is defined by anisotropically etching the interlayer insulating film 13 using the resist 30 as a mask. The interlayer insulating film 13 needs to be performed under a higher selective ratio in relative to metal or barrier metal buried in the resist and lower layer contact.

Subsequently, after removing the resist 30, barrier metal such as Ti, Ta, TaN, and TiN are deposited in the first via contact hole 13a in a thickness of 1 nm to 100 nm by, for example, sputtering or CVD process. Then, metal material such as tungsten, aluminum and copper are deposited in a thickness of 10 nm to 1000 nm so as to fill the first via contact hole 13a. Thereafter, planarization is carried out by being etched back by CMP process, or the like to obtain the form illustrated in FIGS. 17A to 17C.

Figure 18A:
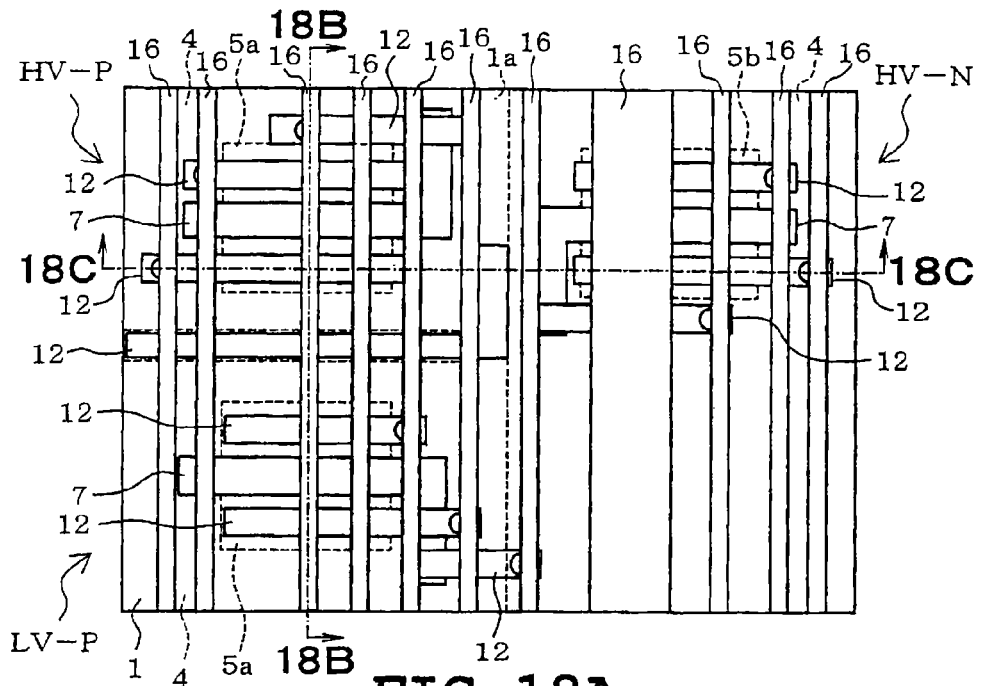
Figure 18B:
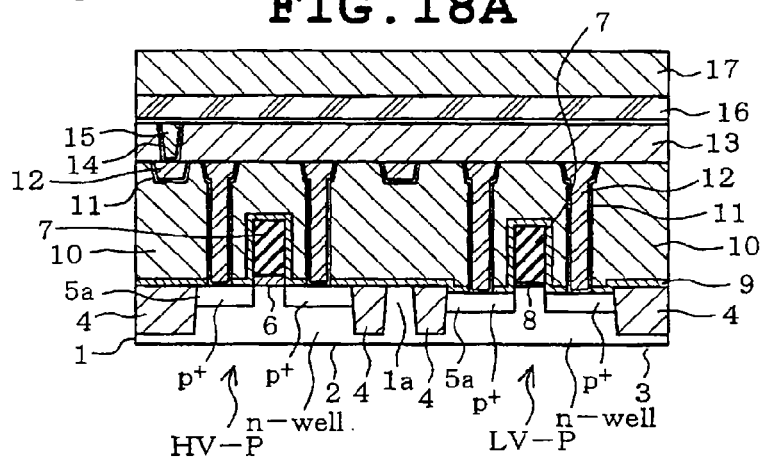
Figure 18C:
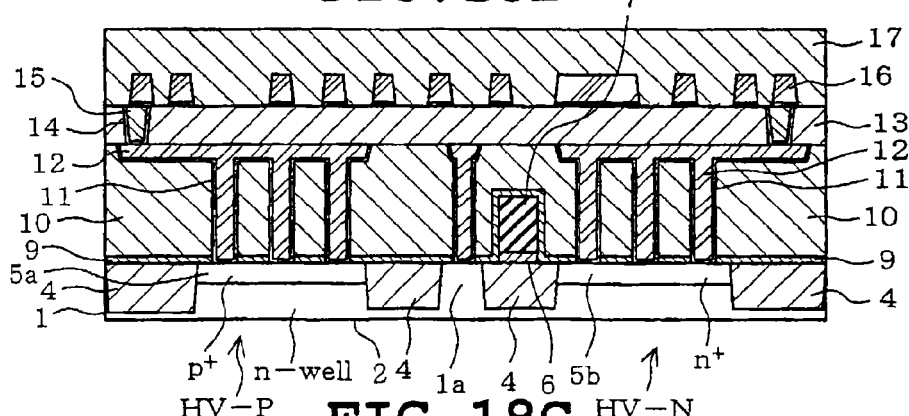

Thereafter, as shown in FIGS. 18A and 18C, Al or AlCu, for example, is deposited on the order of 10 nm to 1000 nm. Further, Al or AlCu is processed into a strip-form oriented in the 18B-18B direction to form an interconnection layer 16 that serves as data transfer line. Then, silicon oxide film, silicon nitride film, silicate glass such as BPSG and PSG and interlayer films such as HSQ, MSQ, and SILK are deposited on the order of 10 nm to 1000 nm.

Figure 19A:
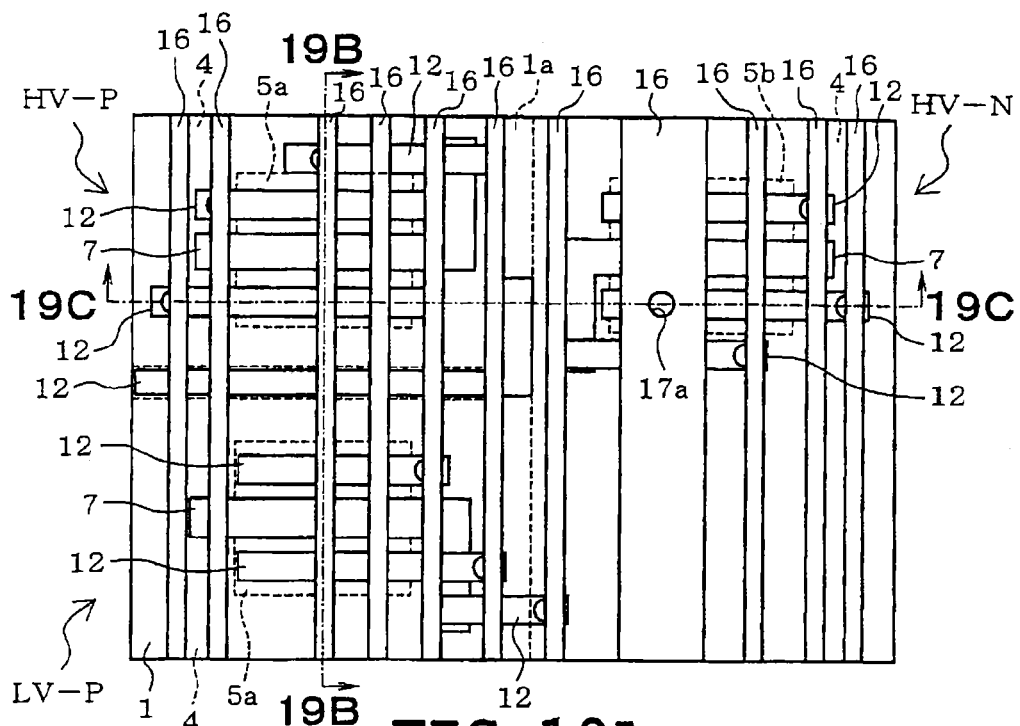
Figure 19B:
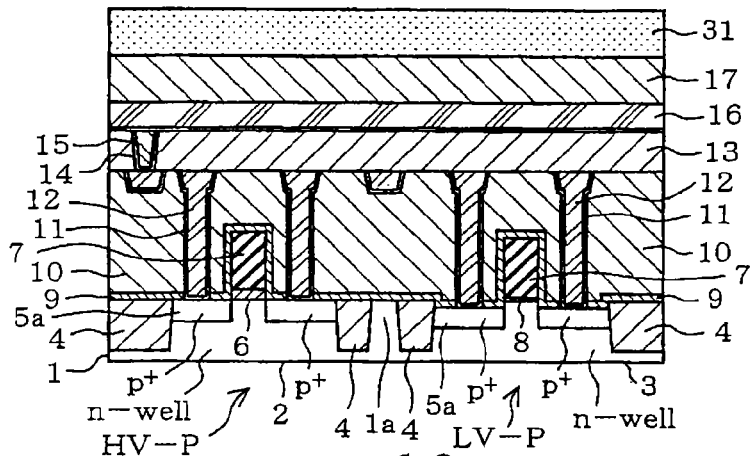
Figure 19C:
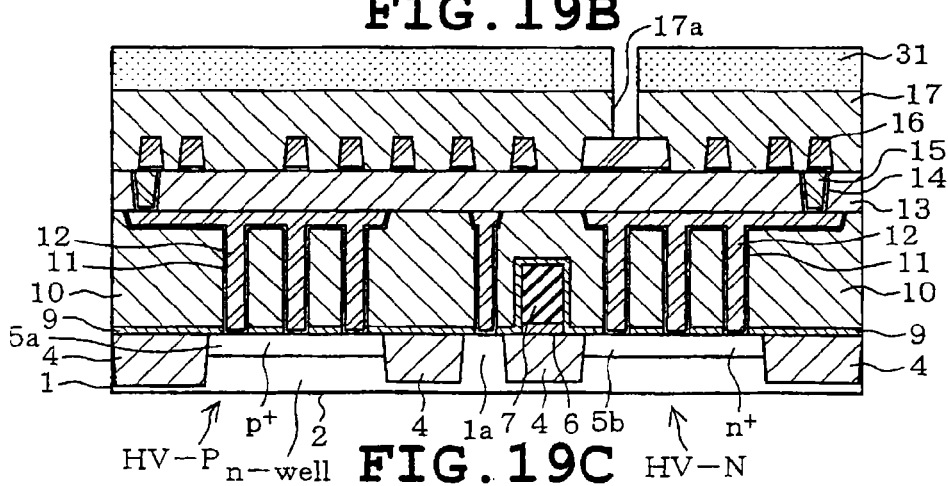
Figure 20A:
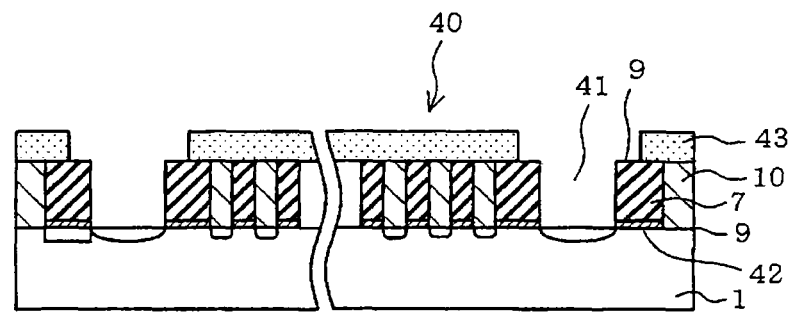
FIGS. 20A to 20C are schematic sectional views of a memory cell region indicating a second embodiment of the present invention.
Figure 20B:
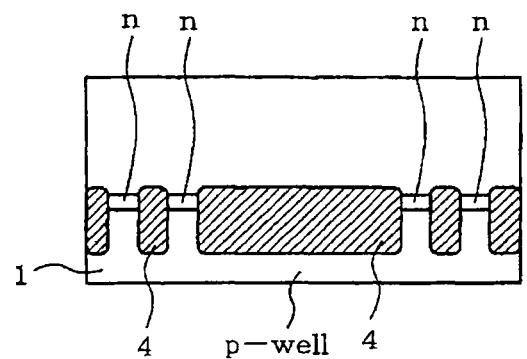
Figure 20C:
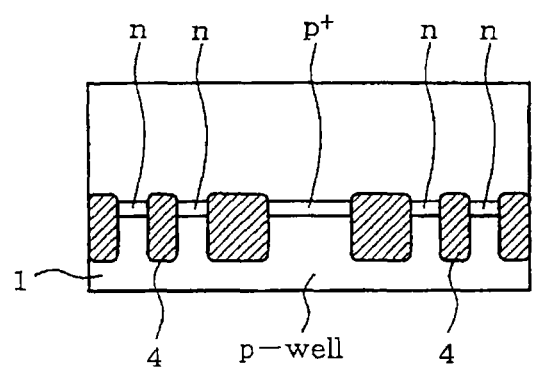
Figure 21:
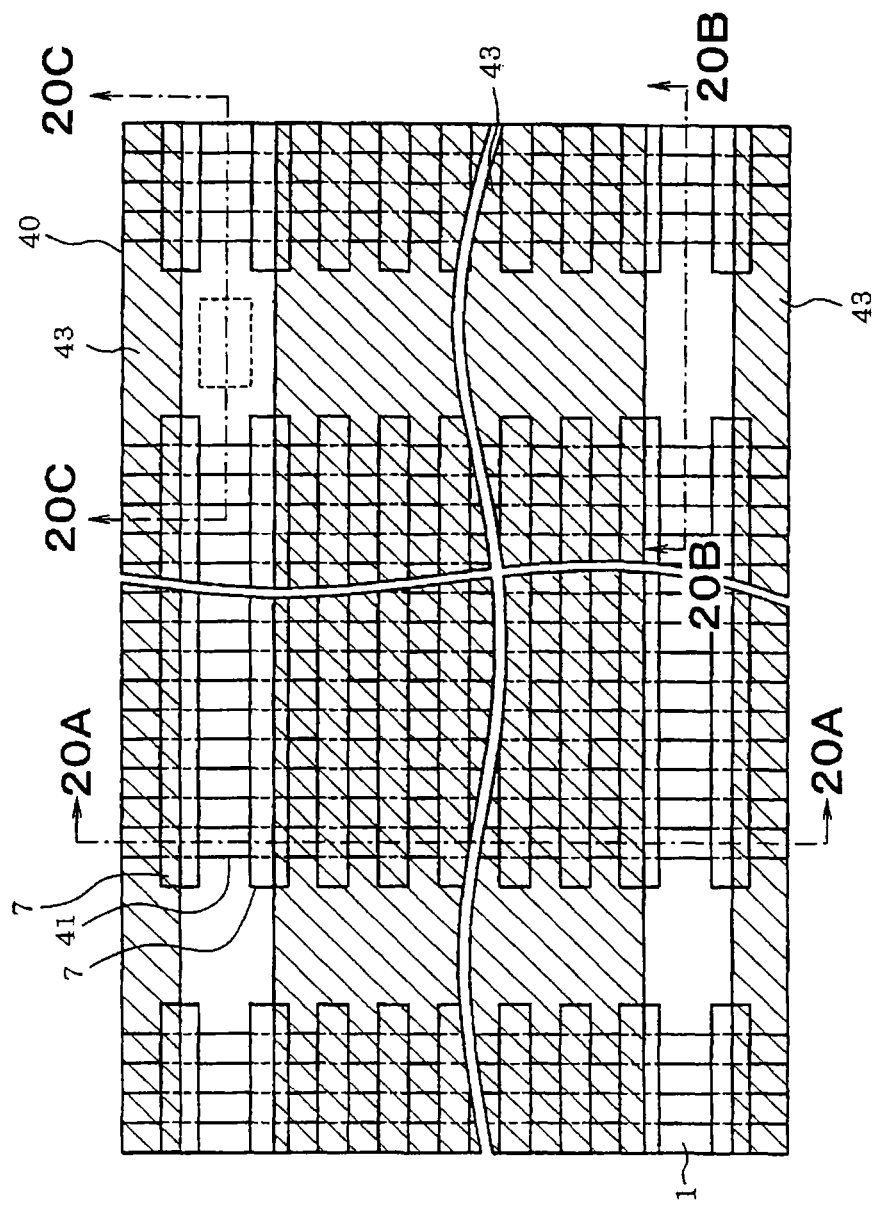
FIG. 21 is a plan view of a memory cell region.

Next, the resist 31 is coated by lithography process and the second via contact hole 17a is patterned by coating a resist 31 by lithography process. Then, as shown in FIGS. 19A to 19C, the interlayer insulating film 17 is patterned by anisotropic etch. The interlayer insulating film 17 is performed under a higher selective ratio in relative to metal or barrier metal buried in the resist 31 and lower layer contact.

Subsequently, after removing the resist 31, barrier metal such as Ti, Ta, TaN, and TiN are deposited in the second via contact hole 17a by, for example, sputtering or CVD process. Then, metal material such as tungsten, aluminum and copper are deposited in a thickness of 10 nm to 1000 nm and buried into the second via contact hole 17a, as well as being deposited as a interconnection material of a source line 18.

In this case, the manufacturing method of the first via contact hole 13a and data transfer line is applicable. That is, barrier metal such as Ti, Ta, TaN, and TiN are deposited in the second via contact hole 17a by, for example, sputtering or CVD process in a thickness of 1 mn to 100 nm. Then, metal material such as tungsten, aluminum and copper are deposited in a thickness of 10 nm to 1000 nm to fill the second via contact hole 17a and are planarized by CMP, or the like whereafter Al or AlCu is deposited on the order of 10 to 1000 nm as interconnection material. However, the present embodiment indicates an example of depositing the via contact with electrical conductive material for the source line 18 for the purpose of enabling process simplification.

Lastly, the final form of the present embodiment is obtained by processing the deposited Al, AlCu, or the like on the order of 10 nm to 1000 nm by anisotropic etch performed in lithography process.

The present embodiment provides the following effects. Upon removing the gate insulating film 6 of the high-voltage transistors HV-P and HV-N by RIE process, or the like after forming the gate electrode 7, the gate insulating film 8 of the low-voltage P-channel transistor LV-P is also removed at the same time. Thus, implanting of channel impurity ions for N-diffusion layer to be performed thereafter can be carried out by reusing the resist 27 used in RIE process upon removing the gate insulating film. As a result, lithography process can be simplified, and the times of lithography process can be reduced, thereby reducing the process cycle and cost.

In the above process, because of the thinness of the gate insulating film 8, the silicon substrate 1 is recessed when RIE is performed on the low-voltage P-channel transistor LV-P. However, the influence of the resultant short channel effect can be resolved by, for example, a halo implantation of impurity ions.

Also, upon forming the diffusion layers 5a and 5b of the high-voltage transistors HV-P and HV-N, and low-voltage transistor LV-P respectively, the impurity ion implantation therefor are performed simultaneously. Thus, not only can the impurity profile of the two be aligned, but the controllability of electrical profile can be improved by merely specifying a single impurity profile.

Also, regarding the transistors in the memory cell and the low-voltage N-channel transistors, since the implantation of channel impurity ions carried out in the N-diffusion layer for the high-voltage transistors is not performed, the diffusion layer can be engineered separately, and the short channel effect can be restrained.

FIGS. 20A to 20C and 21 illustrate a second embodiment of the present invention. The second embodiment differs from the first embodiment in the process of removing the remaining gate insulating film after formation of the gate electrode of the first embodiment. In the first embodiment, upon removing the gate insulating film 6 of the high-voltage transistors HV-P and HV-N, the gate insulating film 8 of the low-voltage P-channel transistor LV-P is removed simultaneously. As opposed to this, in the present embodiment, the gate insulating film of the cell contact portion in the memory transistor is removed simultaneously.

That is, an opened resist 43 (hatched region in FIG. 21 indicates resist 43 forming region) is formed in order that the gate insulating film 42 of the cell contact portion 41 formed in the select gate of the memory cell region 40 is simultaneously removed along with the gate insulating film of the high-voltage transistors HV-P and HV-N and the low-voltage P-channel transistor LV-P. In this case, the gate insulating film of the cell transistor forming region of the memory cell portion 40 and the low-voltage N-channel transistor of the peripheral circuit region not shown selectively retain the resist 43 by lithography process.

As aforementioned, since the gate insulating film 6 of the high-voltage transistors HV-P and HV-N is approximately five times thicker than the gate insulating film 8 of the low-voltage transistor portion, upon completely removing the gate insulating film 6 of the high-voltage transistor region by RIE process, or the like, the cell contact portion and the low-voltage P-channel transistor portion are over-etched to a considerable extent. Thus, despite the need for a highly selective ratio in relative to the silicon substrate 1, since the applied selective ratio is 30 at most, the silicon surfaces of the cell contact portion 41 and the low-voltage transistor portion are recessed to some extent.

Though the cell contact portion and low-voltage P-channel transistor of the present embodiment involves silicon gouging, no significant effect is imposed on the cell contact portion; rather, such configuration provides the advantage of reducing contact resistance.

FIGS. 22 to 28 illustrate a third embodiment of the present invention which differs from the first embodiment in the process removing the remaining gate insulating film after forming the gate electrode 7. In the first embodiment, upon removing the gate insulating film 6 of the high-voltage transistors HV-P and HV-N and the gate insulating film 8 of the low-voltage P-channel transistor LV-P, the gate insulating films 6 and 8 overlaying the exposed portion of the element forming region on the silicon substrate 1, that is, the portion inclusive of the boundary between the impurity diffusion region and the STI 4 is removed. Contrastingly, in the present embodiment, as for the high-voltage transistors HV-P and HV-N, the gate insulating film is removed so as to retain the portion overlaying the proximity of the boundary between the impurity diffusion region and the STI 4 forming region.

Such arrangement provides protection against adverse effects of performing the etch process in which the opening defined in the resist is inclusive of the STI 4 forming region. That is, when the thick gate insulating film 6 is over-etched and etched away by using a mask pattern that exposes the STI 4, the STI 4 is consequently etched down as well.

The height of the upper surface of the STI 4 is lowered substantially in level with the silicon substrate 1 surface. Therefore, when the STI 4 is further recessed, the etched portion alone receives greater depth of impurity when impurities are doped into the adjacent silicon substrate 1. As a result, the width of the insulated region between the adjacent transistor intervened by the STI 4 is narrowed, consequently reducing the electrical characteristic.

Hence, in the present embodiment, the gate insulating film 6 of the high voltage transistors HV-P and HV-N is removed as follows. That is, after processing the gate electrode 7, the gate insulating film 6 overlaying the silicon substrate 1 of the transistor device region alone is etched away for impurity ion implantation to be performed thereafter. Consequently, the silicon oxide film filled in the STI 4 can be prevented from being recessed from the substrate surface. Thus, formation of a deep impurity diffusion layer in close proximity with the STI 4 is prevented, as well as enabling the voltage deterioration of the transistor device.

Figure 22:
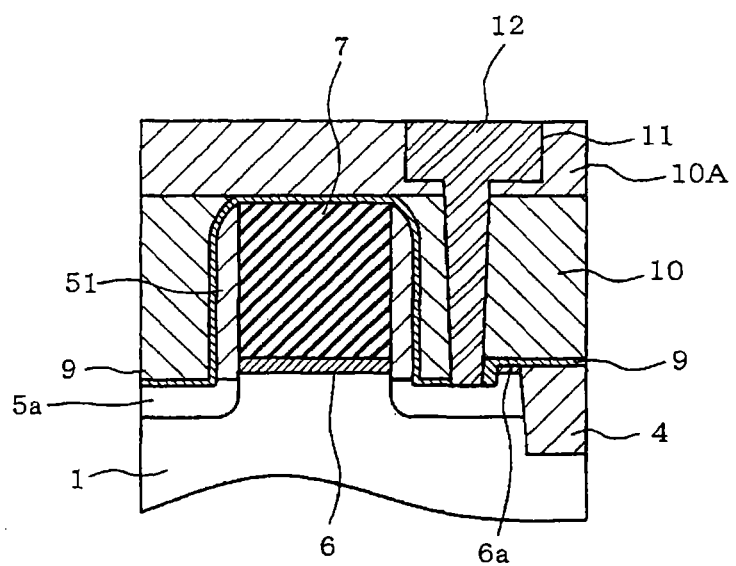
FIG. 22 is a schematic sectional view of a high-voltage transistor indicating a third embodiment of the present embodiment.

The feature of the present embodiment is described hereinafter with reference to FIG. 22 exemplifying a partial configuration of the high-voltage P-channel transistor HV-P. FIG. 22 corresponds to the configuration of the process indicated in FIGS. 15A to 15C and illustrate interlayer insulating films 10 and 10A (since interlayer insulating film 10 comprises a plurality of layers, here, the upper layer is referred as interlayer insulating film 10A) that include contact plugs 12.

FIG. 22 illustrates a gate insulating film 6a retained on the silicon substrate 1 surface such to overlay the boundary surface of the STI 4. It can be observed from FIG. 22 that the gate insulating film 6a originally having the same thickness as the gate insulating film 6 is thinned to the shown thickness by being etched in the later described process.

Also, in the present embodiment, a small depth of two-step silicon gouging can be observed on the silicon substrate 1 of the impurity diffusion region 5a. More specifically, the silicon substrate 1 surface is slightly recessed in a spacer 51 forming portion and is further recessed in the contact forming region as compared with the portion where the gate insulating film 6 is formed.

Thus, silicon gouging is caused by not being able to specify an infinite selective ratio in relative to the silicon substrate 1 when etching the film formed on the silicon substrate 1 surface by RIE process, or the like. Generally, an etch process is performed so as to absorb the inter-process differences. Hence, the etch process is continued even after the silicon substrate 1 surface is exposed after removing the films, consequently etching the exposed silicon substrate 1. The drawings illustrate an exaggerated example of silicon gouging.

Figure 23:
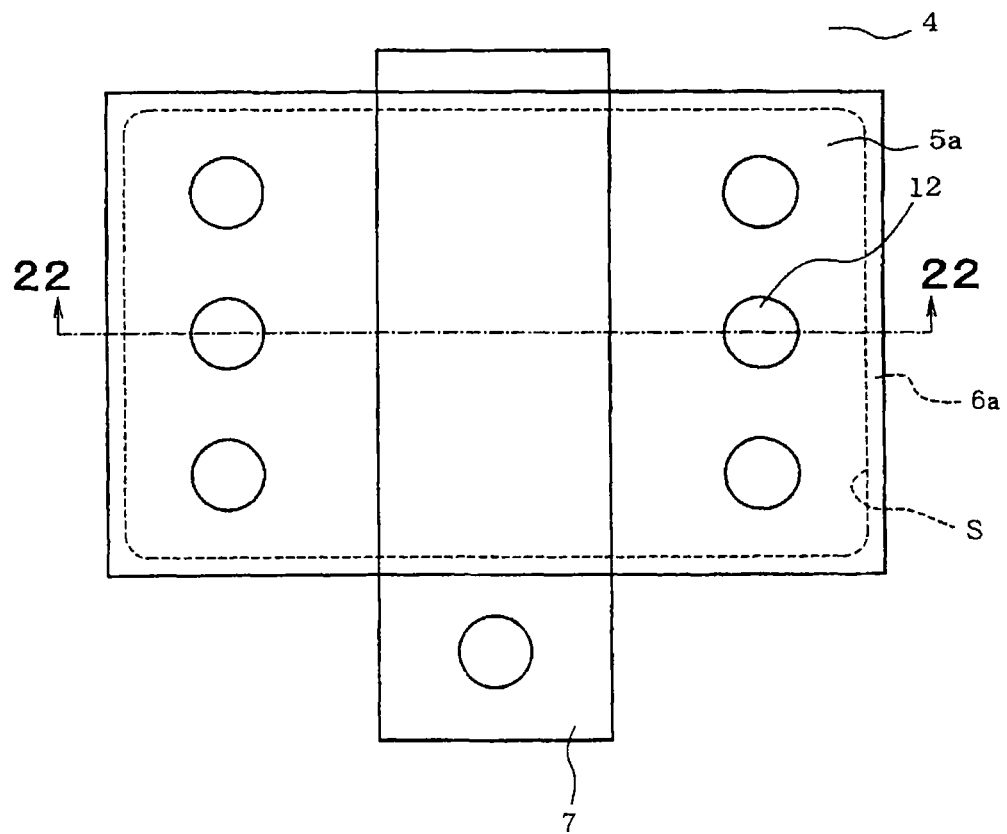
FIG. 23 is a plan view of the high-voltage transistor.

FIG. 23 is a plan view of the high-voltage P-channel transistor HV-P, and FIG. 22 is a sectional view taken along line 22-22. The broken line S shown in FIG. 23 indicates a resist pattern for removing the gate insulating film 6 defined therein, and the gate insulating film 6a indicates a remainder of the patterned gate insulating film 6.

Next, the manufacturing process of the above configuration will be described.

Figure 24:
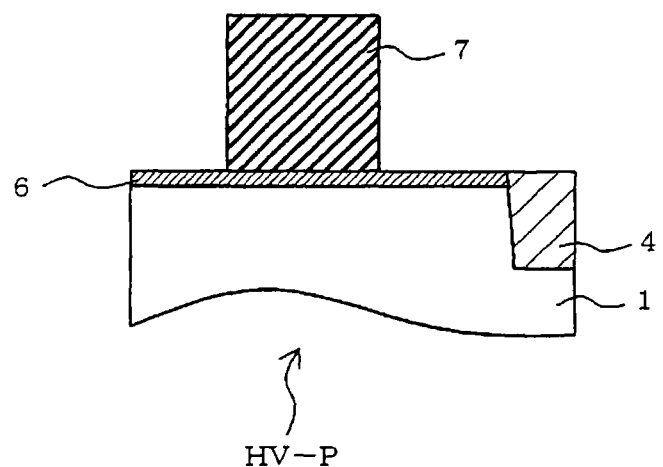
FIGS. 24 to 28 are sectional views indicating each phase of the manufacturing process.

FIG. 24 illustrates the state of the high-voltage P-channel transistor HV-P having been formed with the gate electrode 7. This corresponds to the state illustrated in FIGS. 8A to 8C in the first embodiment.

Figure 25:
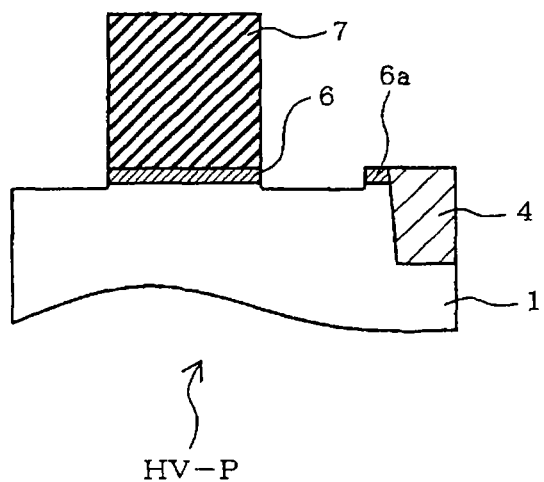

As shown in FIG. 25, the thick gate insulating film 6 having a thickness on the order of 35 nm and overlaying the silicon substrate 1 (source/drain) of the high-voltage P-channel transistor HV-P is etched and removed from this state. At this time, in the present embodiment, as shown in the broken line S in FIG. 23, the targeted region of the etch process is restricted within the high-voltage P-channel transistor HV-P region. More specifically, the etch process is limited to the inner side of the STI 4, thereby preventing the recessing of the STI 4 from the silicon substrate. Thus, the gate insulating film 6 remains unetched at the side of the STI 4.

Figure 26:
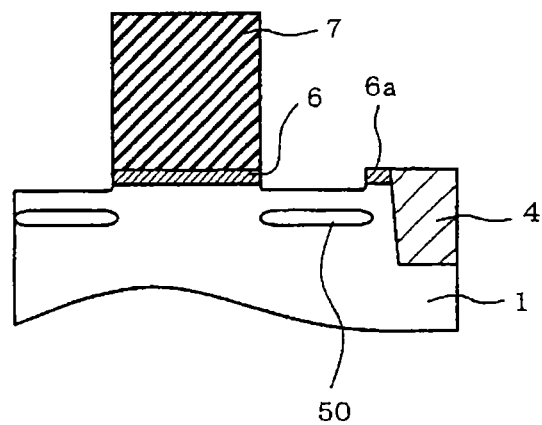

Next, after performing post-oxidation, ions are doped to form the diffusion region, at which point the low-voltage N-channel transistor assumes an LDD structure and forms the N-layer by doping impurities such as As (arsenic), in a dose of $3.0 \times 10^{13}$ [atoms/cm$^2$] at the energy of 20 keV. At this time, the N-diffusion region of a cell array portion in the memory cell region is formed simultaneously. Also, regarding the high-voltage P-channel transistor HV-P, as shown in FIG. 26, ion implantation of P (phosphorus) is performed in a dose of $4.5 \times 10^{12}$ [atoms/cm$^2$] at an energy of 30 keV as Halo implantation. At this time, since the thick gate insulating film 6a remains at the side of the STI 4, it needs to be noted that mean projected range of impurity is shortened in the proximity of the STI 4.

Figure 27:
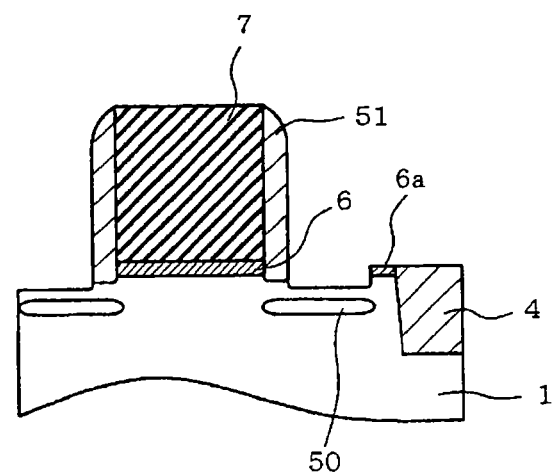

Next, as shown in FIG. 27, TEOS film is formed at a thickness of 80 nm and etched back as done conventionally for the purpose of forming the side wall spacer 51 of the peripheral transistor portion and filling the gaps between the word lines of the memory cell portion. At this time, the thickness of the gate insulating film 6a residing at the side of the STI 4 is reduced due to over-etch. More specifically, since the 80 nm TEOS film is over-etched on the order of 30%, the film thickness of the gate insulating film 6a remaining at the side of the STI 4 is 10 nm or less as shown in FIG. 27. At this time, since the STI 4 is similarly etched; the resultant height thereof is arranged in close proximity with the silicon substrate 1 surface.

Figure 28:
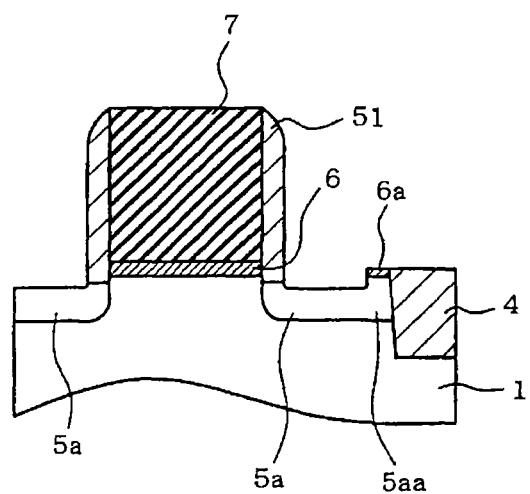

Next, as shown in FIG. 28, for the purpose of forming the diffusion layer in the source/drain region of the transistor, ion implantation of As (arsenic) is performed on the N-channel transistor HV-N, and likewise, ion implantation of B (boron) is performed on the P-channel transistor HV-P in a dose on the order of $3.0 \times 10^{15}$ [atoms/cm$^2$] respectively. FIG. 28 exemplifies the formation of the P+ diffusion layer 5a. In this case, a slight amount of gate insulating film 6a remains at the side of STI 4. Hence, as for the high-voltage transistor HV-P, and HV-N, the diffusion layer 5aa at the side of the STI 4 is formed in a shallow profile.

Thereafter, in accordance with conventional practice, the silicon nitride film is deposited as the barrier insulating film 9 in a film thickness of 20 nm. Then, BPSG film is filled between the gate electrodes and planarized by CMP process, thereafter forming the interlayer insulating film 10. Next, 250 nm of plasma TEOS film is formed as the interlayer insulating film 10A. Thereafter, the contact hole is defined in the bit line contact and the peripheral circuit portion. Then, a trench is formed which becomes the interconnection layer. Ti/TiN film is formed as a barrier metal 11 by sputtering process on the bit line contact, the contact hole, and the interconnection layer, whereafter the contact plug 12 is deposited by CVD process. Next, planarization is performed by CMP process to obtain the configuration of FIG. 22. Thereafter, process proceeds to the backend process.

By employing the above described method, in the peripheral circuit, especially in the case of the high-voltage transistors HV-P and HV-N, the STI 4 can be prevented from being recessed below the silicon substrate 1 so as to improve the punch-through voltage deterioration. As a result, the width of the STI 4 is reduced, thereby enabling the provision of a semiconductor device having smaller chip region.

In the present embodiment, the gate insulating film 6a remains at the side of the STI 4, thereby having impurity profile different from the proximity of the gate electrode. Hence, the condition of ion implantation needs to be optimized so as to prevent any failures leading to problems such as increased leakage current in the off-state transistor due to degraded short channel characteristics in the gate edge.

The foregoing description and drawings are merely illustrative of the principles of the present invention and are not to be construed in a limited sense. Various changes and modifications will become apparent to those of ordinary skill in the art. All such changes and modifications are seen to fall within the scope of the invention as defined by the appended claims.

What is claimed:

1. A semiconductor device comprising:
   a semiconductor substrate;
   a first transistor including a first gate insulating film, a first gate electrode on the first gate insulating film, a first diffusion layer in the semiconductor substrate adjacent to the first gate electrode, and a first insulating film above the first diffusion layer; and
   a second transistor including a second gate insulating film, a second gate electrode on the second gate insulating film, and a second diffusion layer in the semiconductor substrate adjacent to the second gate electrode;
   wherein the second gate insulating film directly under the second gate electrode has a second thickness less than a first thickness of the first gate insulating film directly under the first gate electrode, and a lowermost portion of an upper surface of the second diffusion layer is lower than a lower surface of the second gate insulating film directly under the second gate electrode, and a distance between a lowermost portion of an upper surface of the first diffusion layer and a lower surface of the first gate insulating film is less than a distance between the lowermost portion of the upper surface of the second diffusion layer and the lower surface of the second gate insulating film.

2. The device according to claim 1, wherein the second transistor further includes a second insulating film having a third thickness greater than the second thickness above the second diffusion layer.

3. The device according to claim 2, wherein the second insulating film is in direct contact with the second diffusion layer.

4. The device according to claim 1, wherein an upper surface of the first diffusion layer is coplanar with an upper surface of the semiconductor substrate directly under the first gate insulating film.

5. The device according to claim 1, wherein the first insulating film is in direct contact with the first diffusion layer.

6. The device according to claim 1, wherein an upper surface of the second diffusion layer is slightly recessed with respect to an upper surface of the semiconductor substrate directly under the second gate insulating film.

7. The device according to claim 3, wherein an upper surface of the second diffusion layer is slightly recessed with respect to an upper surface of the semiconductor substrate directly under the second gate insulating film.

8. The device according to claim 1, wherein each of the first and second transistors is a p-channel transistor.

\* \* \* \* \*